(12) United States Patent
Moriya

(10) Patent No.: US 11,808,629 B2
(45) Date of Patent: Nov. 7, 2023

(54) SENSOR DEGRADATION EVALUATION METHOD

(71) Applicant: Gigaphoton Inc., Tochigi (JP)

(72) Inventor: Masato Moriya, Oyama (JP)

(73) Assignee: Gigaphoton Inc., Tochigi (JP)

( * ) Notice: Subject to any disclaimer, the term of this patent is extended or adjusted under 35 U.S.C. 154(b) by 0 days.

(21) Appl. No.: 17/818,202

(22) Filed: Aug. 8, 2022

(65) Prior Publication Data
US 2022/0381608 A1    Dec. 1, 2022

Related U.S. Application Data

(63) Continuation of application No. PCT/JP2020/014091, filed on Mar. 27, 2020.

(51) Int. Cl.
*G01J 3/02* (2006.01)
*G01J 3/26* (2006.01)

(52) U.S. Cl.
CPC ............... *G01J 3/027* (2013.01); *G01J 3/26* (2013.01)

(58) Field of Classification Search
CPC ......... G01J 3/027; G01J 3/26; H01S 3/08009; H01S 3/10069; H01S 3/1306;
(Continued)

(56) References Cited

U.S. PATENT DOCUMENTS

| | | |
|---|---|---|
| 2013/0170508 A1 | 7/2013 | Suzuki et al. |
| 2019/0072431 A1* | 3/2019 | Hirose ................ G02F 1/21 |

(Continued)

FOREIGN PATENT DOCUMENTS

| | | | |
|---|---|---|---|
| CN | 109754751 A | * 5/2019 | ........... G09G 3/3225 |
| JP | H01-173677 A | 7/1989 | |

(Continued)

OTHER PUBLICATIONS

JP2010073863A (Translation) (Year: 2010).*

(Continued)

*Primary Examiner* — Tarifur R Chowdhury
*Assistant Examiner* — Carlos Perez-Guzman
(74) *Attorney, Agent, or Firm* — Studebaker & Brackett PC

(57) ABSTRACT

A sensor degradation evaluation method according to an aspect of the present disclosure includes an evaluation step of evaluating degradation of at least one of a sensor for coarse measurement that receives interference fringes produced by a spectrometer for coarse measurement and a sensor for fine measurement that receives interference fringes produced by a spectrometer for fine measurement, and the evaluation step includes causing a plurality of kinds of laser light having wavelengths different from one another to be sequentially incident on the spectrometer for coarse measurement and the spectrometer for fine measurement and acquiring a coarse-measurement wavelength and a fine-measurement wavelength on a wavelength basis from a plurality of the received interference fringes, acquiring a degradation parameter on a wavelength basis from the coarse-measurement wavelength and the fine-measurement wavelength on a wavelength basis, and comparing the degradation parameter on a wavelength basis with a threshold.

20 Claims, 17 Drawing Sheets

(58) Field of Classification Search
CPC ...... H01S 3/225; H01S 3/08004; H01S 3/134; H01S 3/137; G03F 7/70025; G03F 7/70575; G03F 7/7085; G03F 7/70975; G03F 7/70591

See application file for complete search history.

(56) References Cited

U.S. PATENT DOCUMENTS

| | | | |
|---|---|---|---|
| 2019/0285996 A1* | 9/2019 | Shibayama | ............. B29C 43/04 |
| 2021/0349398 A1* | 11/2021 | Mohammadi | ..... H01L 27/14625 |

FOREIGN PATENT DOCUMENTS

| | | |
|---|---|---|
| JP | H06-188502 A | 7/1994 |
| JP | 2001-035782 A | 2/2001 |
| JP | 2001-060545 A | 3/2001 |
| JP | 2001-143993 A | 5/2001 |
| JP | 2002-350232 A | 12/2002 |
| JP | 2010-073863 A | 4/2010 |
| JP | 4629910 B2 | 2/2011 |
| JP | 2013-033932 A | 2/2013 |
| WO | 01/08205 A1 | 2/2001 |
| WO | WO-2022023474 A1 * | 2/2022 |

OTHER PUBLICATIONS

International Search Report issued in PCT/JP2020/014091; dated Jul. 7, 2020.
International Preliminary Report on Patentability and Written Opinion issued in PCT/JP2020/014091; dated Sep. 22, 2022.

* cited by examiner

FIG. 9
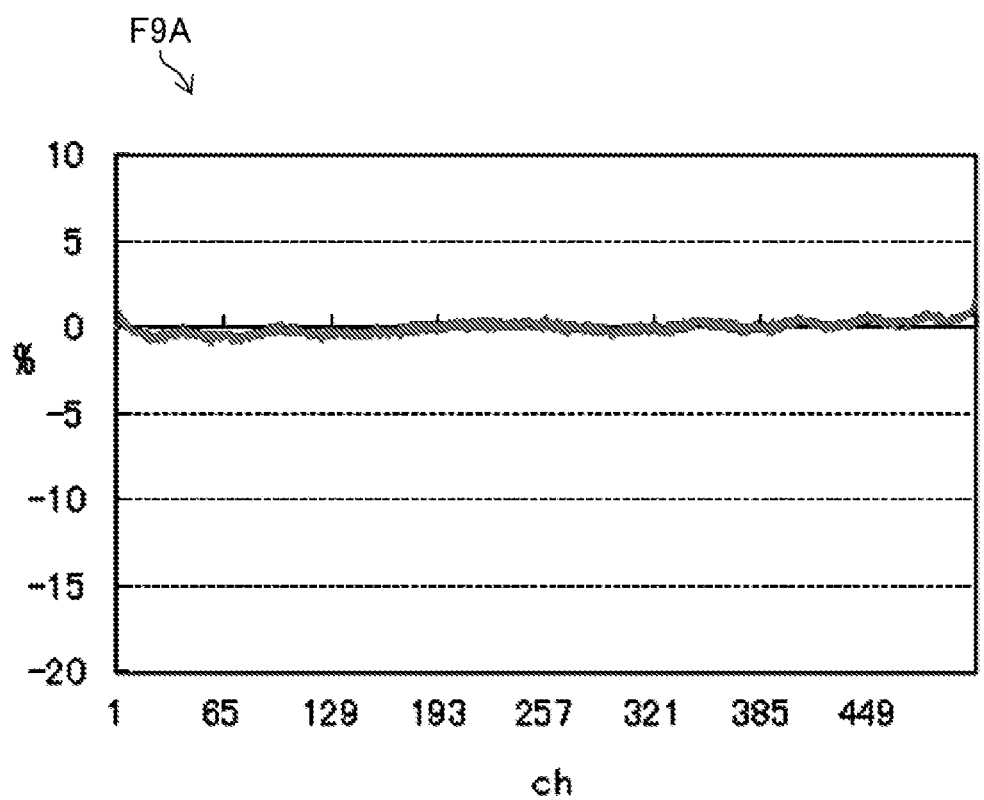
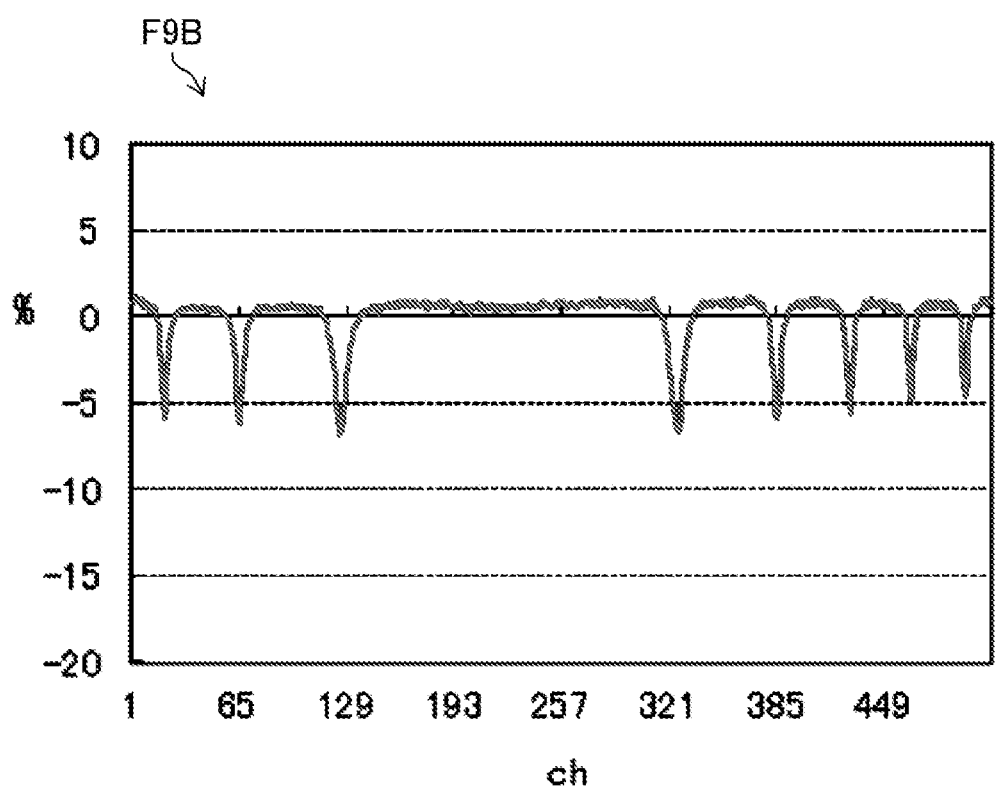

FIG. 12
F12A
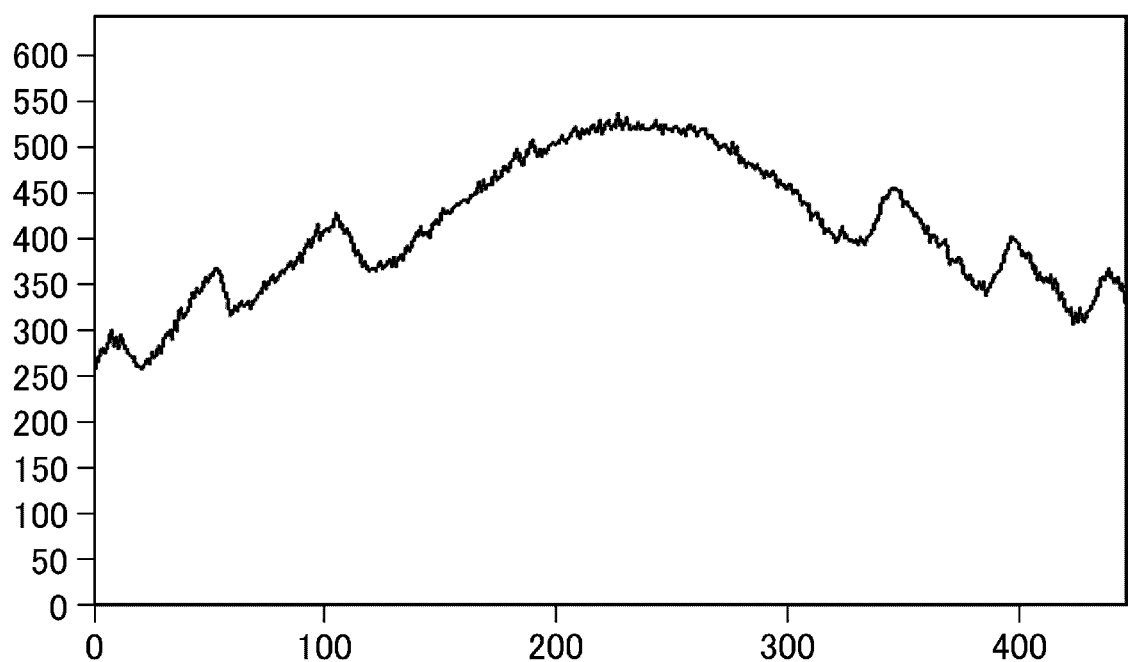
F12B
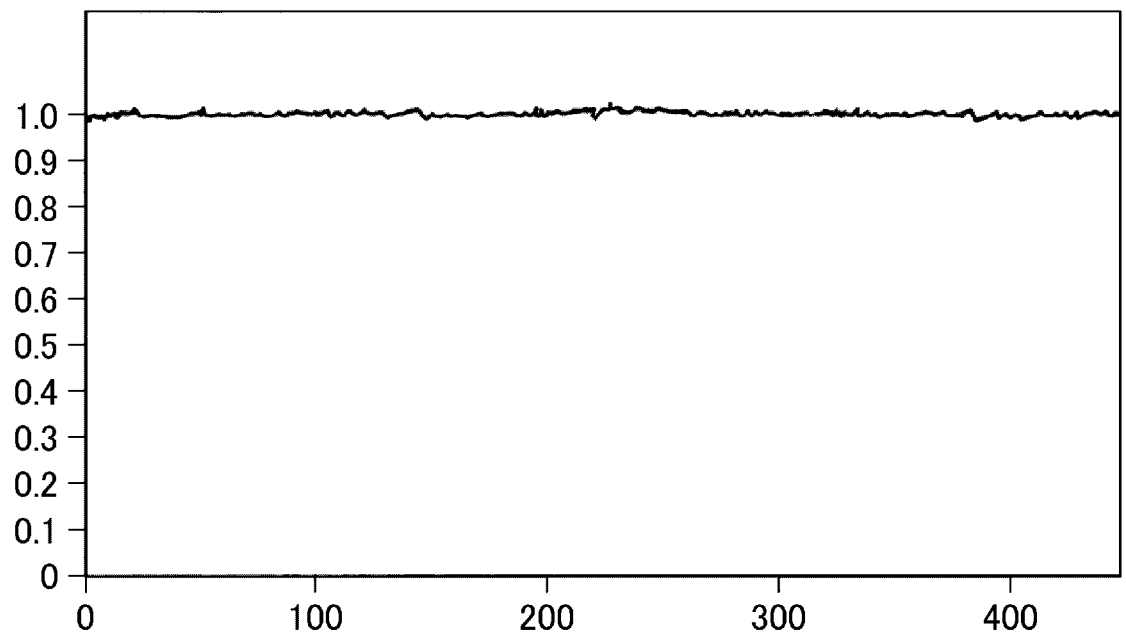

FIG. 13
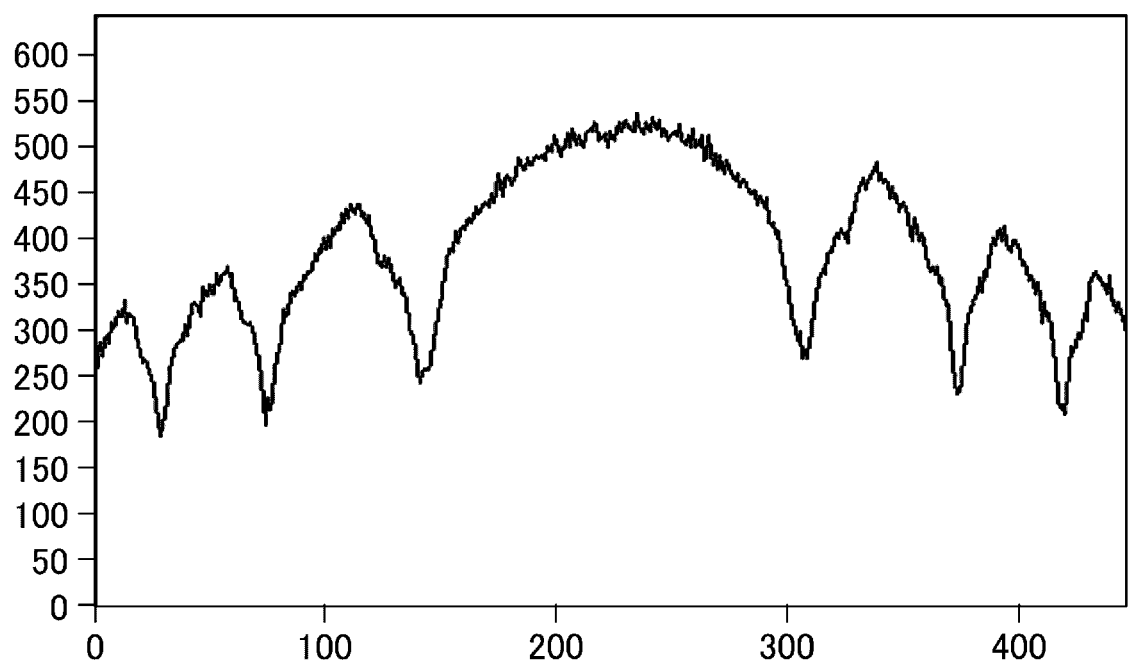
F13A
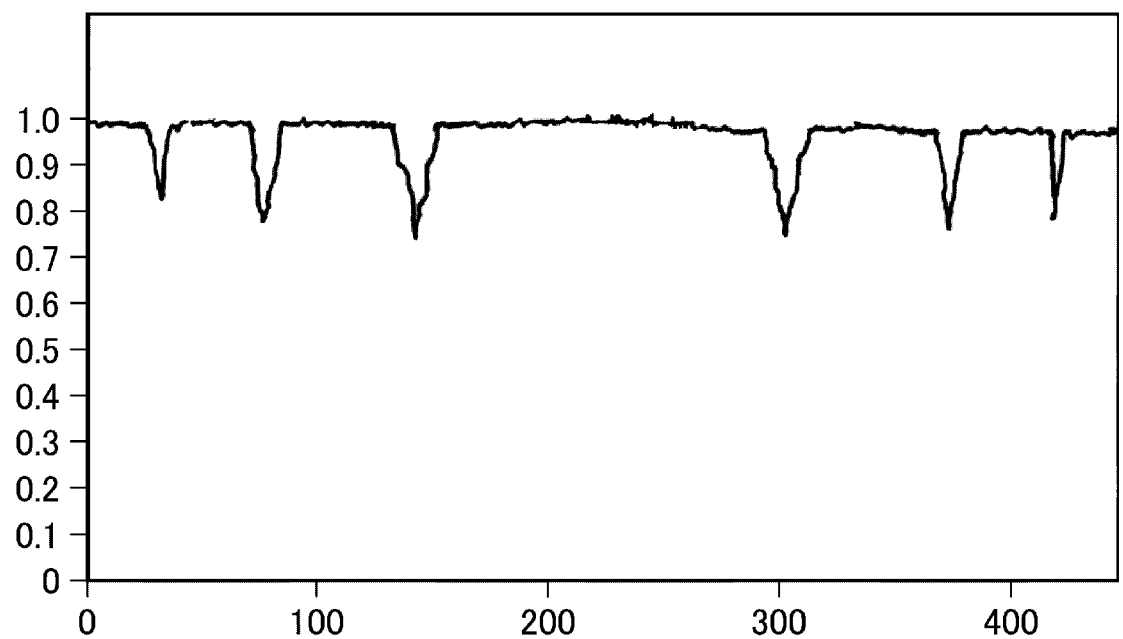
F13B ically integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

SENSOR DEGRADATION EVALUATION METHOD

CROSS-REFERENCE TO RELATED APPLICATIONS

The present application is a continuation application of International Application No. PCT/JP2020/014091, filed on Mar. 27, 2020, the entire contents of which are hereby incorporated by reference.

BACKGROUND

1. Technical Field

The present disclosure relates to a sensor degradation evaluation method.

2. Related Art

In recent years, a semiconductor exposure apparatus is required to improve the resolution thereof as semiconductor integrated circuits are increasingly miniaturized and highly integrated. To this end, reduction in the wavelength of light outputted from a light source for exposure is underway. For example, a KrF excimer laser apparatus, which outputs laser light having a wavelength of about 248 nm, and an ArF excimer laser apparatus, which outputs laser light having a wavelength of about 193 nm, are used as a gas laser apparatus for exposure.

The light from spontaneously oscillating KrF and ArF excimer laser apparatuses has a wide spectral linewidth ranging from 350 to 400 pm. A projection lens made of a material that transmits ultraviolet light, such as KrF and ArF laser light, therefore produces chromatic aberrations in some cases. As a result, the resolution of the projection lens may decrease. To avoid the decrease in the resolution, the spectral linewidth of the laser light outputted from the gas laser apparatus needs to be narrow enough to make the chromatic aberrations negligible. To this end, a line narrowing module (LNM) including a line narrowing element (such as etalon and grating) is provided in some cases in a laser resonator of the gas laser apparatus to narrow the spectral linewidth. A gas laser apparatus providing a narrowed spectral linewidth is hereinafter referred to as a narrowed-line gas laser apparatus.

CITATION LIST

Patent Literature

[PTL 1] Japanese Patent No. 4629910
[PTL 2] JP-A-1-173677
[PTL 3] JP-A-6-188502

SUMMARY

A sensor degradation evaluation method according to an aspect of the present disclosure includes an evaluation step of causing a processor to evaluate degradation of at least one of a sensor for coarse measurement configured to receive interference fringes produced by a spectrometer for coarse measurement and a sensor for fine measurement configured to receive interference fringes produced by a spectrometer for fine measurement having resolution higher than resolution of the spectrometer for coarse measurement, and an output step of causing the processor to output a result of the evaluation, and the evaluation step includes a coarse-measurement wavelength acquisition step of causing a plurality of kinds of laser light having wavelengths different from one another to be sequentially incident on the spectrometer for coarse measurement and acquiring a coarse-measurement wavelength on a wavelength basis from a plurality of the interference fringes sequentially received by the sensor for coarse measurement, a fine-measurement wavelength acquisition step of causing the plurality of kinds of laser light to be sequentially incident on the spectrometer for fine measurement and acquiring a fine-measurement wavelength on a wavelength basis from a plurality of the interference fringes sequentially received by the sensor for fine measurement, a degradation parameter acquisition step of acquiring a degradation parameter on a wavelength basis from the coarse-measurement wavelength and the fine-measurement wavelength measured on a wavelength basis and a comparison step of comparing the degradation parameter on a wavelength basis with a threshold.

A sensor degradation evaluation method according to another aspect of the present disclosure includes an evaluation step of causing a processor to evaluate degradation of a sensor configured to receive interference fringes produced by a spectrometer, and an output step of causing the processor to output a result of the evaluation, and the evaluation step includes an intensity distribution acquisition step of causing a plurality of kinds of laser light having wavelengths different from one another to be sequentially incident on the spectrometer and acquiring a plurality of intensity distributions corresponding to a plurality of the interference fringes sequentially received by the sensor, a profile acquisition step of acquiring a profile formed of maximums at pixels of the sensor from the plurality of intensity distributions, a degradation parameter acquisition step of acquiring a degradation parameter for each of the pixels produced by normalizing the profile formed of the maximums, and a comparison step of comparing the degradation parameter for each of the pixels with a threshold.

A sensor degradation evaluation method according to another aspect of the present disclosure includes an evaluation step of causing a processor to evaluate degradation of a sensor configured to receive interference fringes produced by a spectrometer, and an output step of causing the processor to output a result of the evaluation, and the evaluation step includes an intensity distribution acquisition step of causing non-narrowed-line laser light to be incident on the spectrometer and acquiring a first intensity distribution of interference fringes received by the sensor, a degradation parameter acquisition step of normalizing the first intensity distribution by a reference intensity distribution and acquiring a degradation parameter for each of pixels of the sensor, and a comparison step of comparing the degradation parameter for each of the pixels with a threshold.

BRIEF DESCRIPTION OF THE DRAWINGS

Embodiments of the present disclosure will be described below only by way of example with reference to the accompanying drawings.

FIG. 9 shows an example of a normalized U profile.

FIG. 12 shows an example of a free-run spectrum in a state in which no degradation has occurred.

FIG. 13 shows an example of a free-run spectrum in a state in which degradation has occurred.

DETAILED DESCRIPTION

Figure 1:
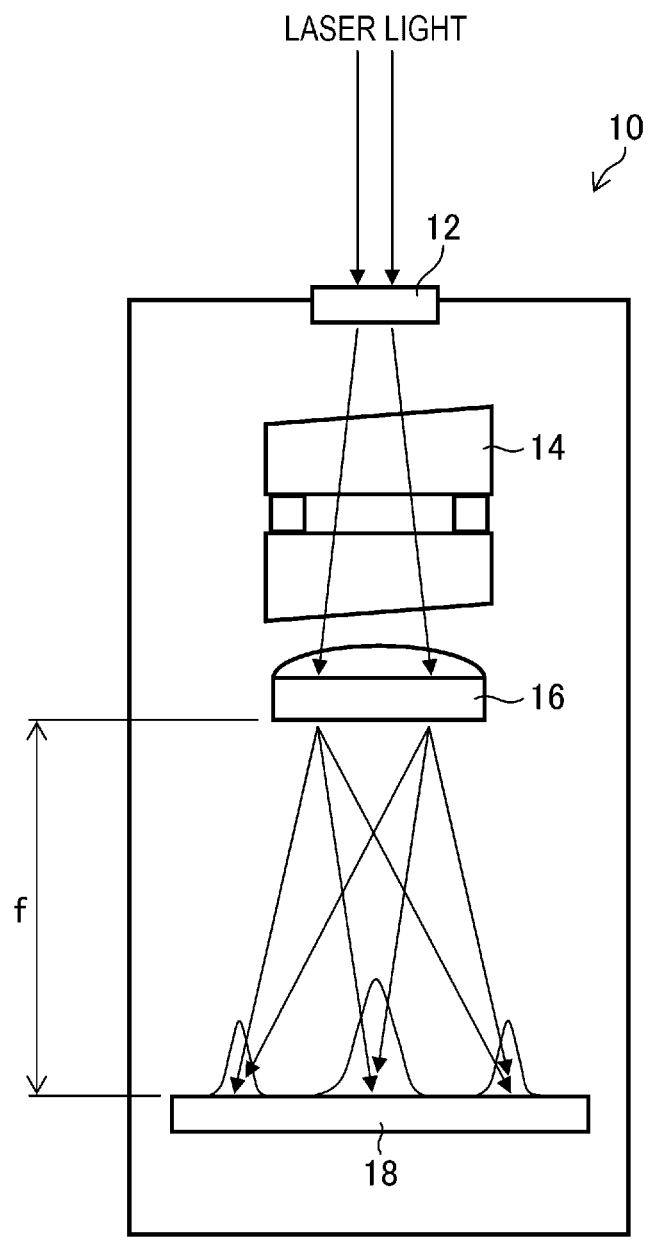
FIG. 1 is a diagrammatic view showing a schematic configuration of an etalon spectrometer.

<Contents>
1. Description of terminology and technology
1.1 Principle of etalon spectrometer
1.2 Calculation of measurement wavelength
2. Overview of narrowed-line laser apparatus (Comparative Example 1)
2.1 Configuration of narrowed-line laser apparatus
2.2 Operation
3. Overview of narrowed-line laser apparatus (Comparative Example 2)
3.1 Configuration of narrowed-line laser apparatus
3.2 Operation
4. Problems
5. First Embodiment
5.1 Configuration
5.2 Operation
5.3 Effects and advantages
6. Second Embodiment
6.1 Configuration
6.2 Operation
6.3 Effects and advantages
7. Third Embodiment
7.1 Configuration
7.2 Operation
7.3 Effects and advantages
8. Fourth Embodiment
8.1 Configuration
8.2 Operation
8.3 Effects and advantages
9. Fifth Embodiment
9.1 Configuration
9.2 Operation
9.3 Effects and advantages
10. Method for manufacturing electronic devices
11. Others Embodiments of the present disclosure will be described below in detail with reference to the drawings. The embodiments described below show some examples of the present disclosure and are not intended to limit the contents of the present disclosure. Further, all configurations and operations described in the embodiments are not necessarily essential as configurations and operations in the present disclosure. The same component has the same reference character, and no redundant description of the same component will be made.

1. Description of Terminology and Technology

1.1 Principle of Etalon Spectrometer

FIG. 1 is a diagrammatic view showing a schematic configuration of an etalon spectrometer 10. The etalon spectrometer 10 includes a diffuser 12, a Fabry-Perot (FP) etalon 14, a focusing lens 16, and an image sensor 18, as shown in FIG. 1. The image sensor 18 may be a photodiode array.

Laser light is incident on the diffuser 12. The diffuser 12 scatters the incident laser light. The scattered light enters the FP etalon 14. The laser light having passed through the FP etalon 14 enters the focusing lens 16. The laser light passes through the focusing lens 16 and produces interference fringes at the focal plane of the focusing lens 16. The image sensor 18 is disposed at the focal plane of the focusing lens 16, which has a focal length f. The light having passed through and having been focused by the focusing lens 16 produces interference fringes at the image sensor 18. The image sensor 18 detects the produced interference fringes.

1.2 Calculation of Measurement Wavelength

In general, the interference fringes produced by an etalon are expressed by Expression (1) below.

$$\lambda = \frac{2nd}{m}\cos\theta = \frac{2nd}{m}\left(1 - \frac{r_m^2}{2f^2}\right) \quad (1)$$

In Expression (1), $\lambda$ represents the wavelength of the laser light, n represents the refractive index of the air gap, d represents the inter-mirror distance, m represents an integer, $\theta$ represents the angle of incidence of the laser light, and $r_m$, represents the radius of each of the interference fringes.

The square of the radius $r_m$, of each of the interference fringes is proportional to the wavelength $\lambda$ of the laser light, as indicated by Expression (1). The spectral linewidth of the entire laser light (spectrum profile) and the center wavelength thereof can therefore be detected from the detected interference fringes. The spectral linewidth and the center wavelength may be determined by an information processing apparatus that is not shown or a wavelength controller (wavelength controller 60 in FIG. 3, for example) from the detected interference fringes.

Figure 2:
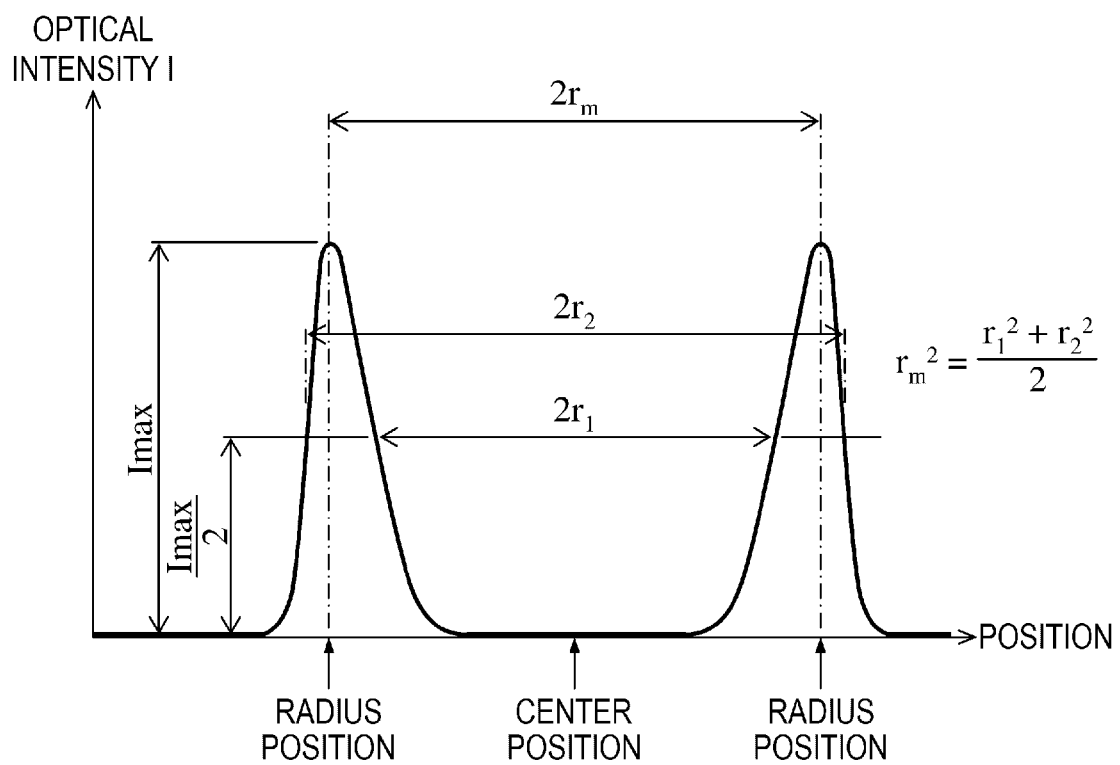
FIG. 2 shows the optical intensity distribution of an interference fringe detected by an image sensor.

FIG. 2 shows the optical intensity distribution of an interference fringe detected by the image sensor 18. In FIG. 2, the horizontal axis represents the position on the detection surface of the image sensor 18, and the vertical axis represents an optical intensity I. The square of the radius $r_m$, of the interference fringe may be calculated from the average of the square of a radius $r_1$ of the inner portion of the interference fringe at the half-maximum position and the square of a radius $r_2$ of the outer portion of the interference fringe at the half-maximum position. That is, the square of the radius $r_m$, of the interference fringe may be determined from Expression (2) below.

$$r_m^2 = (r_1^2 + r_2^2)/2 \quad (2)$$

2. Overview of Narrowed-Line Laser Apparatus (Comparative Example 1)

2.1 Configuration of Narrowed-Line Laser Apparatus

Figure 3:
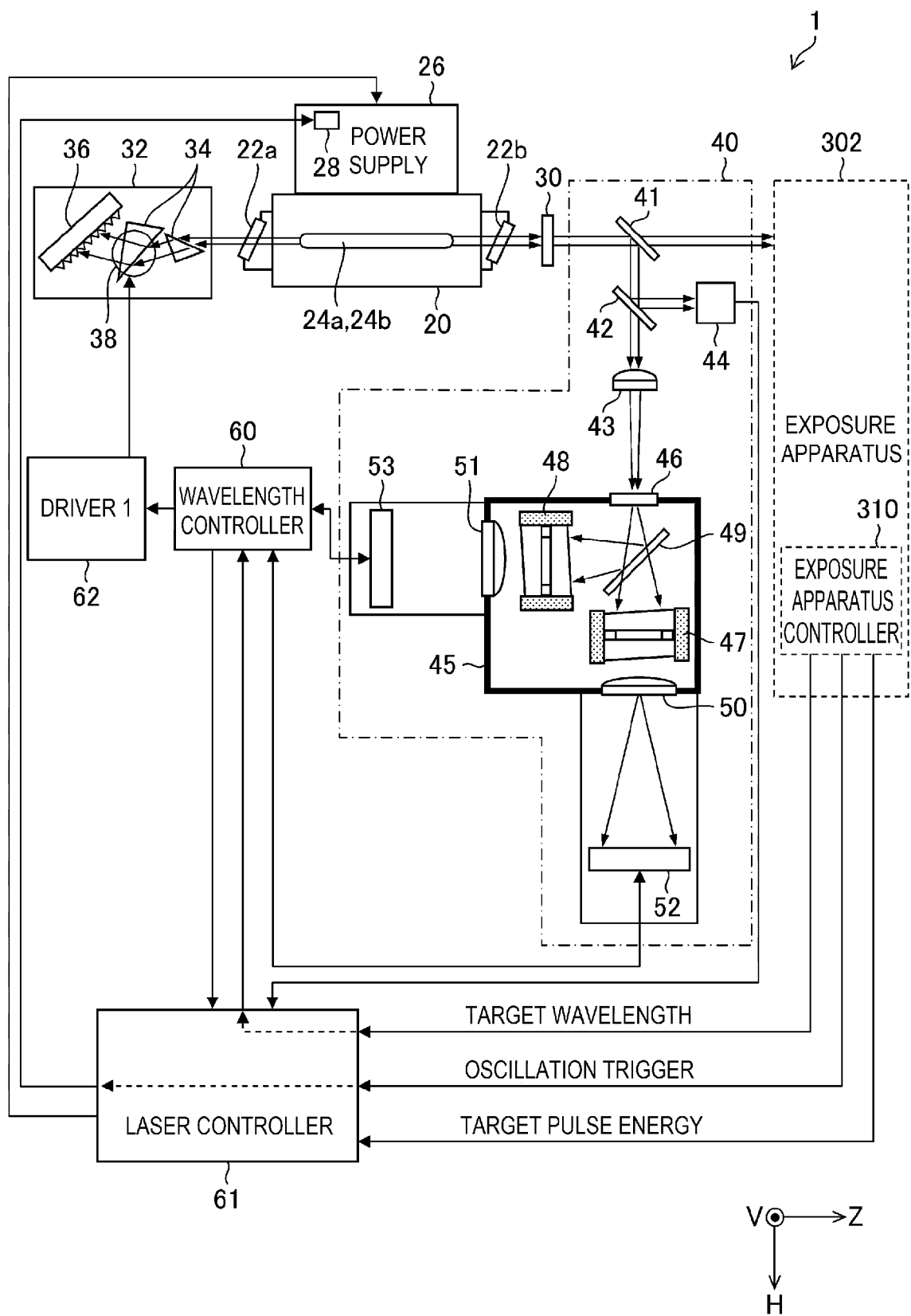
FIG. 3 shows the configuration of a narrowed-line laser apparatus according to Comparative Example 1.

Comparative Example in the present disclosure is an aspect that the applicant is aware is known only by the applicant, and is not a publicly known example that the applicant is self-aware of. FIG. 3 shows the configuration of a narrowed-line laser apparatus 1 according to Comparative Example 1. The narrowed-line laser apparatus 1 includes a chamber 20, a power supply 26, an output coupling mirror 30, a line narrowing module 32, a monitor module (MM) 40, a wavelength controller 60, a laser controller 61, and a driver 62, as shown in FIG. 3.

The output coupling mirror 30 and the line narrowing module 32 form a laser resonator. The chamber 20 is disposed in the optical path of the laser resonator. The line narrowing module 32 includes a plurality of (two, for example) prisms 34, a grating 36, and a rotary stage 38.

The prisms 34 are so disposed as to function as a beam expander. The grating 36 is disposed in the Littrow arrangement, which causes the angle of incidence of the light incident on the grating 36 to be equal to the angle of diffraction of the light diffracted by the grating 36. One of the prisms 34 is placed on the rotary stage 38 and disposed so as to change the angle of incidence of the light to be incident on the grating 36 when the rotary stage 38 rotates the prism 34.

The chamber 20 includes windows 22a and 22b and a pair of electrodes 24a and 24b. The chamber 20 accommodates a laser gas. The laser gas may contain, for example, an Ar or Kr gas as a rare gas, an $F_2$ gas as a halogen gas, and an Ne gas as a buffer gas.

The electrodes 24a and 24b (example of pair of discharge electrodes) are so disposed in the chamber 20 that the electrodes 24a and 24b face each other in the direction perpendicular to the plane of view of FIG. 3 (direction V) and the longitudinal direction of the electrodes coincides with the optical path of the laser resonator, and the electrodes 24a and 24b are connected to the power supply 26. The windows 22a and 22b (example of first and second windows) are so disposed that the laser light having been excited by the discharge and amplified between the discharge electrodes passes through the windows 22a and 22b.

The power supply 26 includes a switch 28 and is so connected that a high voltage is applied to the space between the electrodes 24a and 24b in the chamber 20 when the switch 28 is closed.

The output coupling mirror 30 is coated with a film that reflects a portion of the laser light and transmits the other portion thereof.

The monitor module 40 includes a beam splitter 41, a beam splitter 42, a focusing lens 43, a pulse energy monitor 44, a sealed chamber 45, a line sensor 52, and a line sensor 53.

The beam splitter 41 is so disposed in the optical path of the laser light having exited via the output coupling mirror 30 that the laser light reflected off the beam splitter 41 is incident on the beam splitter 42. The laser light having transmitted through the beam splitter 41 exits out of the narrowed-line laser apparatus 1. An exposure apparatus 302 is so disposed that the laser light outputted by the narrowed-line laser apparatus 1 enters the exposure apparatus 302.

The beam splitter 42 is so disposed in the optical path of the laser light reflected off the beam splitter 41 that the laser light reflected off the beam splitter 42 is incident on the pulse energy monitor 44. The pulse energy monitor 44 may be a photodiode, a phototube, or a pyroelectric device.

The focusing lens 43 is so disposed that the laser light having transmitted through the beam splitter 42 enters the focusing lens 43.

The sealed chamber 45 includes a diffuser 46, a fine etalon 47, a coarse etalon 48, a beam splitter 49, a focusing lens 50, and a focusing lens 51.

The diffuser 46 is disposed in the vicinity of the position where the focusing lens 43 focuses light. The diffuser 46 is an optical element made of synthetic quartz and having a flat surface on one side and a ground surface on the other side. The diffuser 46 is attached to the sealed chamber 45 with an O-ring that is not shown so as to seal the sealed chamber 45.

The fine etalon 47 (example of spectrometer for fine measurement) is so disposed that the laser light having passed through the diffuser 46 passes through the beam splitter 49 and enters the fine etalon 47. The beam splitter 49 is so disposed in the optical path between the diffuser 46 and the fine etalon 47 that the laser light partially reflected off the beam splitter 49 enters the coarse etalon 48 (example of spectrometer for coarse measurement). The fine etalon 47 and the coarse etalon 48 are each an air-gap etalon formed of two mirrors that are not shown, are each coated with a partially reflective film, and are in optical contact with each other via a spacer that is not shown.

A free spectral range FSRf of the fine etalon 47 and a free spectral range FSRc of the coarse etalon 48 satisfy the relationship expressed by Expression (3) below.

$$FSRf < FSRc \qquad (3)$$

The free spectral range FSR is expressed by Expression (4) below.

$$FSR = \lambda^2/(2nd) \qquad (4)$$

FSRf and FSRc satisfy FSRf=10 pm and FSRc=400 pm, respectively. FSRc may be 500 pm for KrF excimer laser light or 300 pm for ArF excimer laser light. The fine etalon 47 therefore has resolution higher than that of the coarse etalon 48.

The focusing lens 50 is disposed in the optical path of the laser light having passed through the fine etalon 47 and attached to the sealed chamber 45 with an O-ring that is not shown so as to seal the sealed chamber 45. The focusing lens 51 is disposed in the optical path of the laser light having passed through the coarse etalon 48 and attached to the sealed chamber 45 with an O-ring that is not shown so as to seal the sealed chamber 45. The focal length of the focusing lens 51 is shorter than that of the focusing lens 50.

The line sensor 52 (example of sensor for fine measurement) is disposed at the focal plane of the focusing lens 50, and the line sensor 53 (example of sensor for coarse measurement) is disposed at the focal plane of the focusing lens 51. The line sensors 52 and 53 are each a photodiode array in which a plurality of light-receiving devices (pixels) are arranged in one dimension and each output the intensity distribution of the interference fringes received by the line sensor.

The interference fringes produced by an etalon are expressed by Expression (5) based on Expression (1).

$$m\lambda = 2nd \cdot \cos\theta \qquad (5)$$

The wavelength controller 60 is communicable with the line sensor 52, the line sensor 53, the laser controller 61, and the driver 62. The laser controller 61 is an example of a processor. The processor in the present disclosure is a processing apparatus including a storage that stores a control program and a CPU (central processing unit) that executes the control program. The processor is particularly configured or programmed to carry out a variety of processes contained in the present disclosure. The laser controller 61 is communicable with the power supply 26, the switch 28, the pulse energy monitor 44, and an exposure apparatus controller 310 of the exposure apparatus 302. The driver 62 is communicable with the rotary stage 38.

2.2 Operation

The laser controller 61 reads data on target pulse energy Et and a target wavelength λt from the exposure apparatus controller 310. The laser controller 61 transmits a charging voltage V to the power supply 26 and the target wavelength λt to the wavelength controller 60 so that the pulse energy of the pulsed laser light becomes the target pulse energy Et and the oscillation wavelength becomes the target wavelength λt. The laser controller 61 turns on the switch 28 based on an oscillation trigger transmitted from the exposure apparatus controller 310.

When the switch 28 is turned on, the high voltage is applied to the space between the electrodes 24a and 24b, and the resultant discharge excites the laser gas. When the laser gas is excited, the laser oscillation occurs in the laser resonator formed of the line narrowing module 32 and the output coupling mirror 30, and narrowed-line pulsed laser light is outputted via the output coupling mirror 30.

The pulsed laser light outputted via the output coupling mirror 30 and sampled by the beam splitter 41 is incident on the beam splitter 42. The light having been reflected off the beam splitter 42 is incident on the pulse energy monitor 44, and the light having transmitted through the beam splitter 42 is incident on the diffuser 46 attached to the sealed chamber 45.

The laser controller 61 controls the charging voltage V from the power supply 26 based on the result of the detection performed by the pulse energy monitor 44 in such a way that the pulse energy of the pulsed laser light becomes the target pulse energy Et.

On the other hand, the wavelength controller 60 causes the line sensors 53 and 52 to measure the intensity distributions of the interference fringes produced by the coarse etalon 48 and the fine etalon 47 on a pulse basis, and reads the resultant data. The wavelength controller 60 calculates a measurement wavelength λ of the pulsed laser light on a pulse basis from the data on the intensity distributions of the interference fringes read on a pulse basis. The measurement wavelength λ may not be calculated on a pulse basis and may instead be calculated from data resulting from integration or averaging over a plurality of pulses. Based on the calculated measurement wavelength λ, the wavelength controller 60 controls the rotary stage 38, on which one of the prisms 34 is placed, via the driver 62 in such a way that the oscillation wavelength of the pulsed laser light becomes the target wavelength λt.

As described above, the pulse energy and the oscillation wavelength of the narrowed-line laser apparatus 1 are stably set at the target pulse energy Et and the target wavelength λt provided by the exposure apparatus 302. Since the sealed chamber 45 is sealed, the difference in the refractive index n of the air gap in Expression (4) between the coarse etalon 48 and the fine etalon 47 is suppressed to a small value, so that the wavelength measurement error due to drift of the coarse etalon 48 and the fine etalon 47 decreases.

In general, let F be the finesse of an etalon, the resolution R is expressed as R=FSR/F. When the finesse is substantially fixed, a decrease in FSR results in an increase in resolution R. In a case where the FSR is small, however, when the wavelength changes by the amount of FSR, the interference fringes produced before the change are substantially the same as those produced after the change, so that the two kinds of interference fringes cannot be distinguished from each other through measurement using a single etalon having a small FSR. According to the narrowed-line laser apparatus 1, when the wavelength is changed by about 400 pm and the wavelength is detected with high accuracy, the wavelength can be measured with high accuracy by measuring the interference fringes produced by the fine etalon 47 and the coarse etalon 48 with the line sensors 52 and 53, respectively.

3. Overview of Narrowed-Line Laser Apparatus (Comparative Example 2)

3.1 Configuration of Narrowed-Line Laser Apparatus

Figure 4:
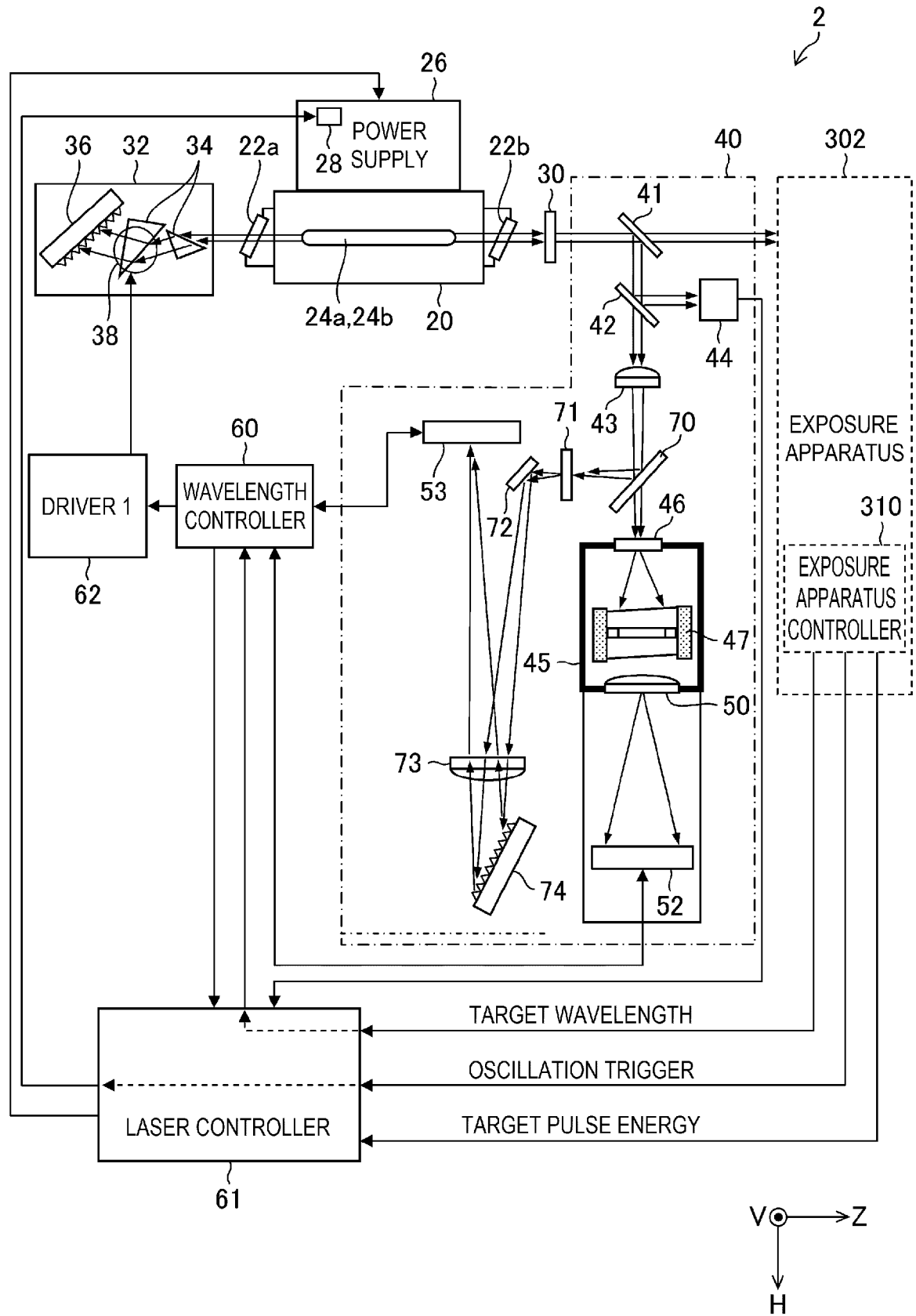
FIG. 4 shows the configuration of a narrowed-line laser apparatus according to Comparative Example 2.

FIG. 4 shows the configuration of a narrowed-line laser apparatus 2 according to Comparative Example 2. The narrowed-line laser apparatus 2 includes a grating spectrometer in place of the coarse etalon 48 in the narrowed-line laser apparatus 1. The narrowed-line laser apparatus 2 includes a beam splitter 70, an aperture 71, a mirror 72, a collimation lens 73, and a grating 74 for coarse measurement, as shown in FIG. 4.

The beam splitter 70 is disposed in the optical path of the laser light having passed through the focusing lens 43. The aperture 71 is disposed in the vicinity of the position where the focusing lens 43 focuses light so that the laser light reflected off the beam splitter 70 passes through the aperture.

The mirror 72 is so disposed that the laser light having passed through the aperture 71 is incident on the mirror 72. The collimation lens 73 is so disposed that the laser light reflected off the mirror 72 enters the collimation lens 73. The grating 74 for coarse measurement is disposed so as to reflect the laser light incident from the collimation lens 73 back toward the collimation lens 73.

The line sensor 53 is so disposed that the laser light having been reflected off the grating 74 for coarse measurement and having passed through the collimation lens 73 is incident on the line sensor 53.

3.2 Operation

The pulsed laser light outputted via the output coupling mirror 30 and sampled by the beam splitter 41 is incident on the beam splitter 42. The light having transmitted through the beam splitter 42 passes through the focusing lens 43 and is incident on the beam splitter 70.

The light having been reflected off the beam splitter 70 passes through the aperture 71, and the light having transmitted through the beam splitter 70 enters the diffuser 46 attached to the sealed chamber 45.

The pulsed laser light having passed through the aperture 71 is reflected off the mirror 72, collimated by the collimation lens 73, and incident on the grating 74 for coarse measurement. The pulsed laser light diffracted by the grating 74 for coarse measurement passes through the collimation lens 73 and produces interference fringes at the line sensor 53.

As described above, according to the narrowed-line laser apparatus 2, the grating spectrometer can measure the wavelength over the wavelength range equivalent to the free spectral range FSRc of the coarse etalon 48. The narrowed-line laser apparatus 2 can therefore measure a wide range of wavelengths with high accuracy by causing the line sensors 53 and 52 to cooperatively measure the interference fringes on a pulse basis, as the narrowed-line laser apparatus 1 can.

4. Problems

The line sensors 52 and 53 of the monitor module 40 are degraded in the course of use. In the related art, the monitor modules 40 used beyond a predetermined number of shots (SL: shot limit) have been replaced in anticipation of the degradation. It has, however, been known that depending on the conditions under which the monitor module 40 is used and individual differences between the line sensors 52 and 53, there are many monitor modules that have been used over the shots well beyond SL but have linearity errors within an acceptable range and can be adequately used.

It is therefore economically desirable to assess the degradation of the uniformity of the sensitivity or the measurement linearity error of the line sensors 52 and 53 in a semiconductor manufacturing plant or any other field, and replace only a problematic monitor module 40. It is therefore desired to employ a strategy of assessing the individual degradation states of the line sensors 52 and 53 to evaluate whether or not replacement is necessary.

5. First Embodiment

5.1 Configuration

The hardware configuration in a first embodiment is the same as that of the narrowed-line laser apparatus 1. The first embodiment differs from Comparative Examples in that the laser controller 61 also carries out processes of a line sensor degradation evaluation method.

5.2 Operation

Figure 5:
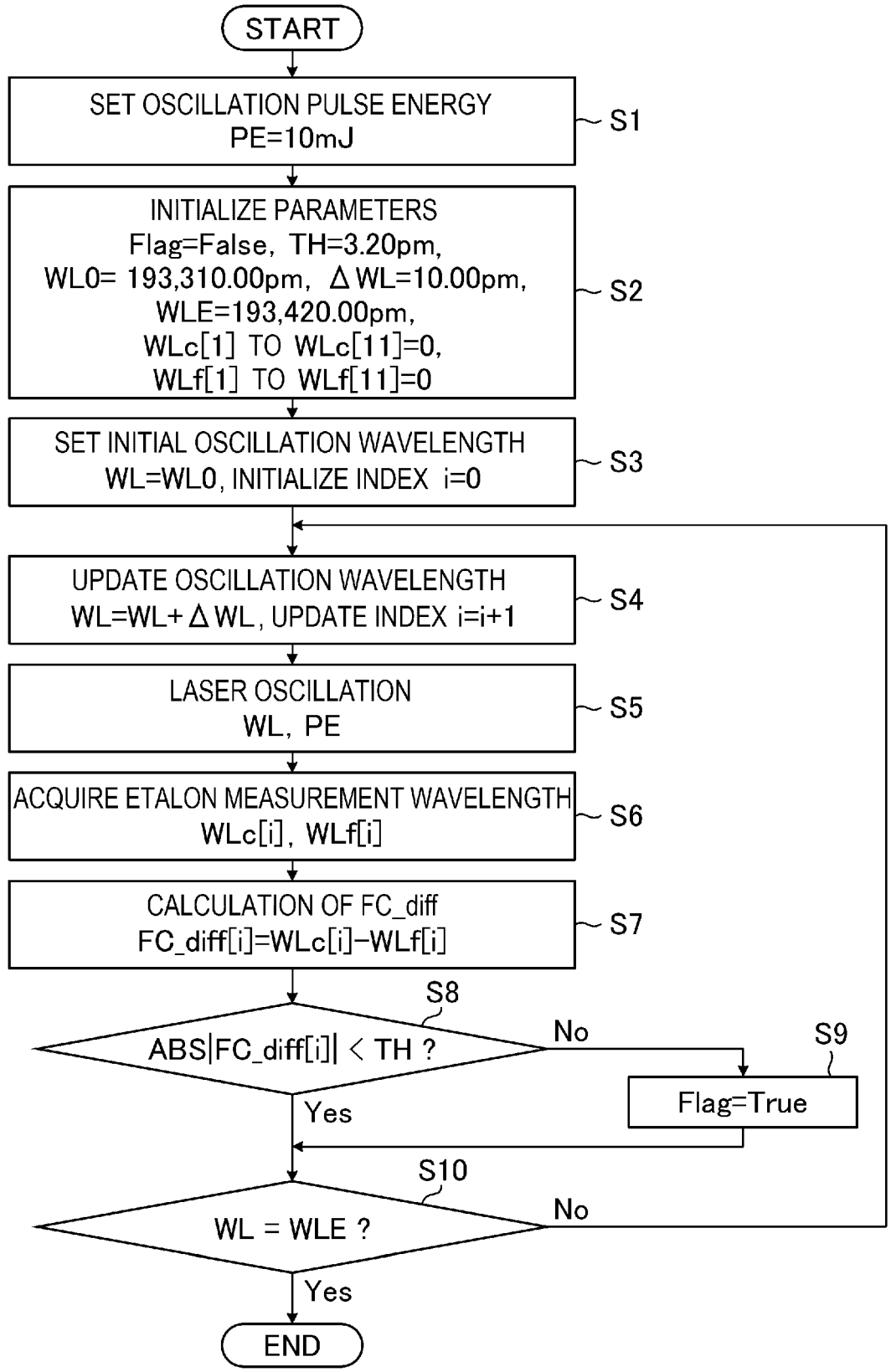
FIG. 5 is a flowchart showing the processes of a line sensor degradation evaluation method.

FIG. 5 is a flowchart showing the processes of the line sensor degradation evaluation method. A case where degradation of at least one of the line sensors 52 and 53 is evaluated will be described below.

In step S1, the laser controller 61 sets an oscillation pulse energy PE at 10 mJ. In the following disclosure, the oscillation pulse energy PE is set at 10 mJ by way of example, and may be set at any other constant value.

In step S2, the laser controller 61 initializes each parameter. In step S2, the laser controller 61 sets an evaluation result Flag at False, a threshold TH at 3.20 pm, an initial oscillation wavelength WL0 at 193,310.00 pm, a wavelength interval ΔWL at 10.00 pm, a final oscillation wavelength WLE at 193,420.00 pm, arrays WLc[1] to WLc[11] at 0, and arrays WLf[1] to WLf[11] at 0.

In step S3, the laser controller 61 sets an oscillation wavelength WL at the initial oscillation wavelength WL0 and initializes an index i, which represents the order of the oscillation wavelengths WL, at 0.

In step S4, the laser controller 61 adds the wavelength interval ΔWL to the oscillation wavelength WL and updates the index i by adding 1 thereto.

In step S5, the laser controller 61 causes the laser oscillation to occur at the oscillation pulse energy PE with the target wavelength λt being equal to the oscillation wavelength WL. The pulsed laser light having the oscillation wavelength WL and the oscillation pulse energy PE enters the sealed chamber 45 via the diffuser 46. The pulsed laser light having entered the sealed chamber 45 is split by the beam splitter 49 into laser light to be incident on the fine etalon 47 and laser light to be incident on the coarse etalon 48 (example of splitting step), and the resultant two types of laser light are incident on the fine etalon 47 and the coarse etalon 48.

In step S6, the laser controller 61 acquires a fine-measurement wavelength calculated by the wavelength controller 60 from the intensity distributions of the interference fringes received by the line sensor 52, and substitutes the acquired fine-measurement wavelength into the array WLf[i] (example of fine-measurement wavelength acquisition step). The laser controller 61 further acquires a coarse-measurement wavelength calculated by the wavelength controller 60 from the intensity distributions of the interference fringes received by the line sensor 53, and substitutes the acquired coarse-measurement wavelength into the array WLc[i] (example of coarse-measurement wavelength acquisition step).

In step S7, the laser controller 61 calculates FC_diff (example of degradation parameter), which is the difference between the coarse-measurement wavelength and the fine-measurement wavelength (measurement wavelength error) (example of degradation parameter acquisition step). In step S7, the value of WLc[i]-WLf[i] is substituted into the array FC_diff[i].

In step S8, the laser controller 61 compares ABSIFC_diff[i]|, which is the absolute value of FC_diff[i], with the threshold TH (example of comparison step) and evaluates whether the threshold TH is greater than ABSIFC_diff[i]| (example of evaluation step). When ABSIFC_diff[i]|<TH is not satisfied, the laser controller 61 carries out the process in step S9 and then carries out the process in step S10. When ABSIFC_diff[i]|<TH is satisfied, the laser controller 61 carries out the process in step S10.

In step S9, the laser controller 61 sets the evaluation result Flag at True (example of output step).

In step S10, the laser controller 61 evaluates whether the oscillation wavelength WL is the final oscillation wavelength WLE. When WL=WLE is not satisfied, the laser controller 61 carries out the process in step S4. When WL=WLE is satisfied, the laser controller 61 terminates the processes of the flowchart.

Repeating the process in step S4 updates the oscillation wavelength WL by incrementing the oscillation wavelength WL by 10.00 pm from 193,320.00 pm to 193,420.00 pm, and updates the index i by incrementing the index i by 1 from 1 to 10. The difference between the smallest value and the largest value of the updated oscillation wavelength WL is smaller than FSRc of the coarse etalon 48. That is, each oscillation wavelength falls within the range FSRc of the coarse etalon 48 and differs from one another only by FSRf of the fine etalon 47. The wavelength interval ΔWL is not limited to FSRf of the fine etalon 47, and may be smaller than FSRf.

Repeating the process in step S5 causes a plurality of kinds of laser light having different oscillation wavelengths WL to be successively incident on the fine etalon 47 and the coarse etalon 48. Repeating the process in step S6 allows acquisition of the coarse-measurement wavelength and the fine-measurement wavelength for each oscillation wavelength WL (example of "on a wavelength basis"). Repeating the process in step S7 allows calculation of FC_diff for each oscillation wavelength WL.

When the process in step S8 is repeated and ABSIFC_diff[i]|<TH is not satisfied even once, the evaluation result Flag is set at True in step S9. That is, when at least one of the degradation parameters is greater than or equal to the threshold TH, the laser controller 61 determines that at least one of the line sensors 52 and 53 has been degraded and outputs a signal that prompts replacement of the monitor module 40. The laser controller 61 may terminate the processes of the flowchart after carrying out the process in step S9.

Figure 6:
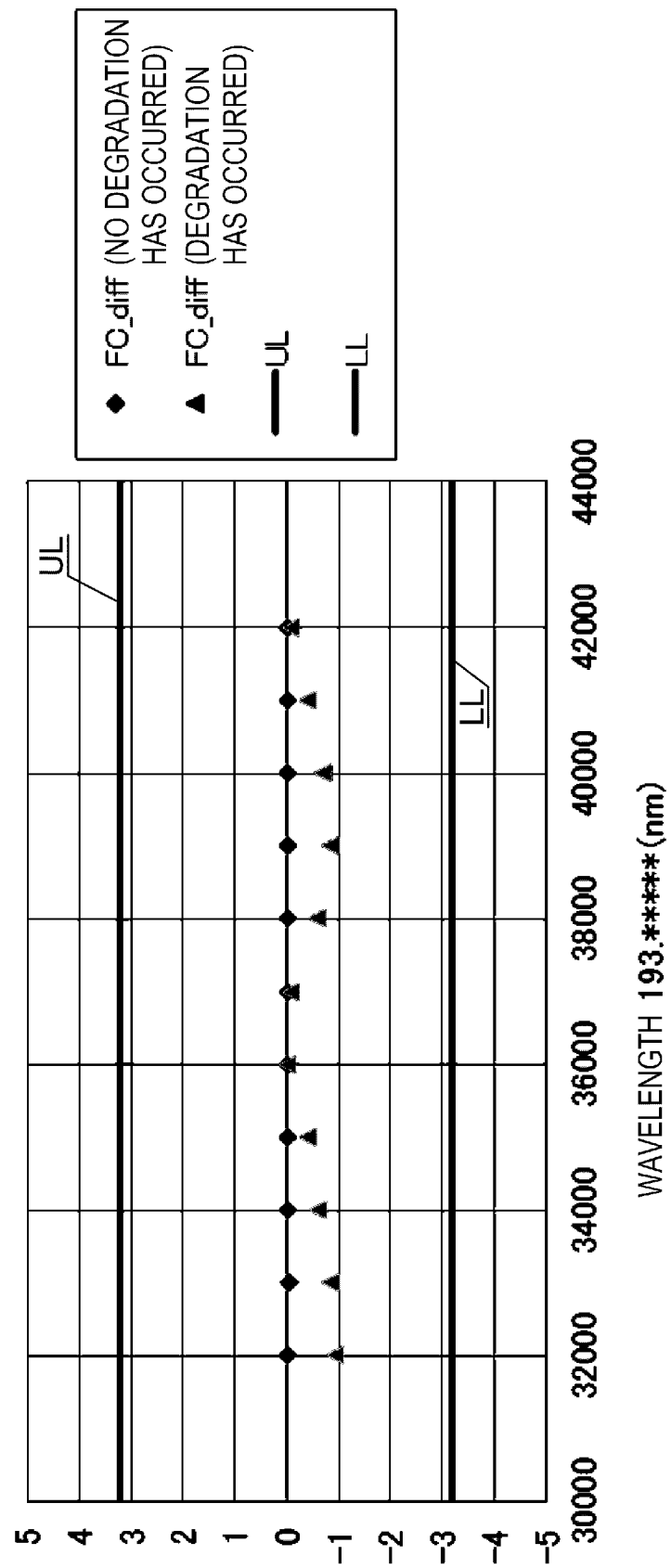
FIG. 6 shows an example of an FC_diff profile.

FIG. 6 shows an example of an FC_diff profile, which is a graph representing FC_diff versus the wavelength. The horizontal axis in FIG. 6 represents the wavelength, is expressed in nm, and shows the portion after the decimal point of 193 nm. The vertical axis in FIG. 6 represents the measurement wavelength error FC_diff and is expressed in pm. In FIG. 6, the FC_diff profile in the case where degradation has occurred is drawn with triangular plotting dots, and the FC_diff profile in the case where no degradation has occurred is drawn with rectangular plotting dots. UL (upper limit) and LL (lower limit) in FIG. 6 are illustrated above and below FC_diff=0 as the reference and separate therefrom by the threshold TH.

The FC_diff profile in the case where no degradation has occurred shows that the measurement wavelength error is 0 pm over the wavelength range of 100.00 pm from 193,320.00 pm to 193,420.00 pm, as shown in FIG. 6. The measurement wavelength error in the FC_diff profile in the case where degradation has occurred is about −1.0 pm depending on the wavelength.

The FC_diff profile in the case where degradation has occurred in FIG. 6 falls within the range between UL and LL and can therefore be determined that no harmful degradation has occurred. Since the absolute value of the measurement wavelength error is about 1.0 pm at the maximum, which is smaller than 3.20 pm, which is the threshold TH, the evaluation result Flag is not set at True but is maintained at False, so that it is considered that no degradation has occurred in the line sensor degradation evaluation method shown in FIG. 5. The laser controller 61 may cause a display device that is not shown to display the graph in FIG. 6 to allow a user to grasp the state of the degradation.

Degradation of at least one of the line sensors 52 and 53 in the narrowed-line laser apparatus 2 may be evaluated in accordance with the line sensor degradation evaluation method shown in FIG. 5.

In the present embodiment, the measurement wavelength error FC_diff is the difference between the coarse-measurement wavelength and the fine-measurement wavelength. It is, however, noted that the difference between the coarse-measurement wavelength and the fine-measurement wavelength only needs to be grasped, and the measurement wavelength error FC_diff may instead be the ratio between the coarse-measurement wavelength and the fine-measurement wavelength or the square difference between the coarse-measurement wavelength and the fine-measurement wavelength. Still instead, the coarse-precision measurement wavelength produced from the coarse etalon may be used to identify the degree of the fine etalon for improvement in the measurement precision of the fine-measurement wavelength, as shown in FIG. 6 in JP-A-6-188502.

A threshold $TH_1$ for warning and a threshold $TH_2$ for errors may be provided as the threshold TH. In this case, as the result of the evaluation performed by the line sensor degradation evaluation method, a signal indicating that the monitor module 40 should be replaced soon may be outputted when the absolute value of the measurement wavelength error exceeds the threshold $TH_1$. Furthermore, when the absolute value of the measurement wavelength error exceeds the threshold $TH_2$, the signal that prompts the replacement of the monitor module 40 may be outputted. In the process described above, the thresholds $TH_1$ and $TH_2$ preferably satisfy $TH_1<TH_2$.

When the laser controller 61 is connected to a rewritable non-transitory storage medium that is not shown, the storage medium stores a program that causes a computer to carry out the processes of the line sensor degradation evaluation method. The program may be stored in the storage medium via a communication line such as the Internet.

5.3 Effects and Advantages

According to the first embodiment, even the narrowed-line laser apparatuses 1 and 2 having been installed in the field can each evaluate degradation of at least one of the line sensors 52 and 53. The state of the degradation of the line sensors 52 and 53 can therefore be grasped at a low cost.

According to the first embodiment, the wavelength is changed within the range of the FSRc of the coarse etalon 48. The pulse energy can therefore be readily maintained constant, whereby relatively high measurement accuracy can be expected. Since the wavelength is not changed beyond the FSRc, there is no risk of losing track of the fringe order of the interference fringes produced by the coarse etalon 48.

Since the interval at which the oscillation wavelength W is changed is equal to FSRf of the fine etalon 47, the positions of the interference fringes produced by the fine etalon 47 are always located at fixed pixels of the line sensor 52. The output from the line sensor 53 can therefore be assessed with the output from the line sensor 52 kept constant, whereby the FC_diff profile primarily represents the amount of degradation of the measurement linearity of the line sensor 53.

6. Second Embodiment 6.1 Configuration

The hardware configuration according to a second embodiment is the same as that of the narrowed-line laser apparatus 1. The laser controller 61 also carries out the processes of the line sensor degradation evaluation method. It is assumed in the following description that the number of pixels of the line sensor 52 is 512.

6.2 Operation

Figure 7:
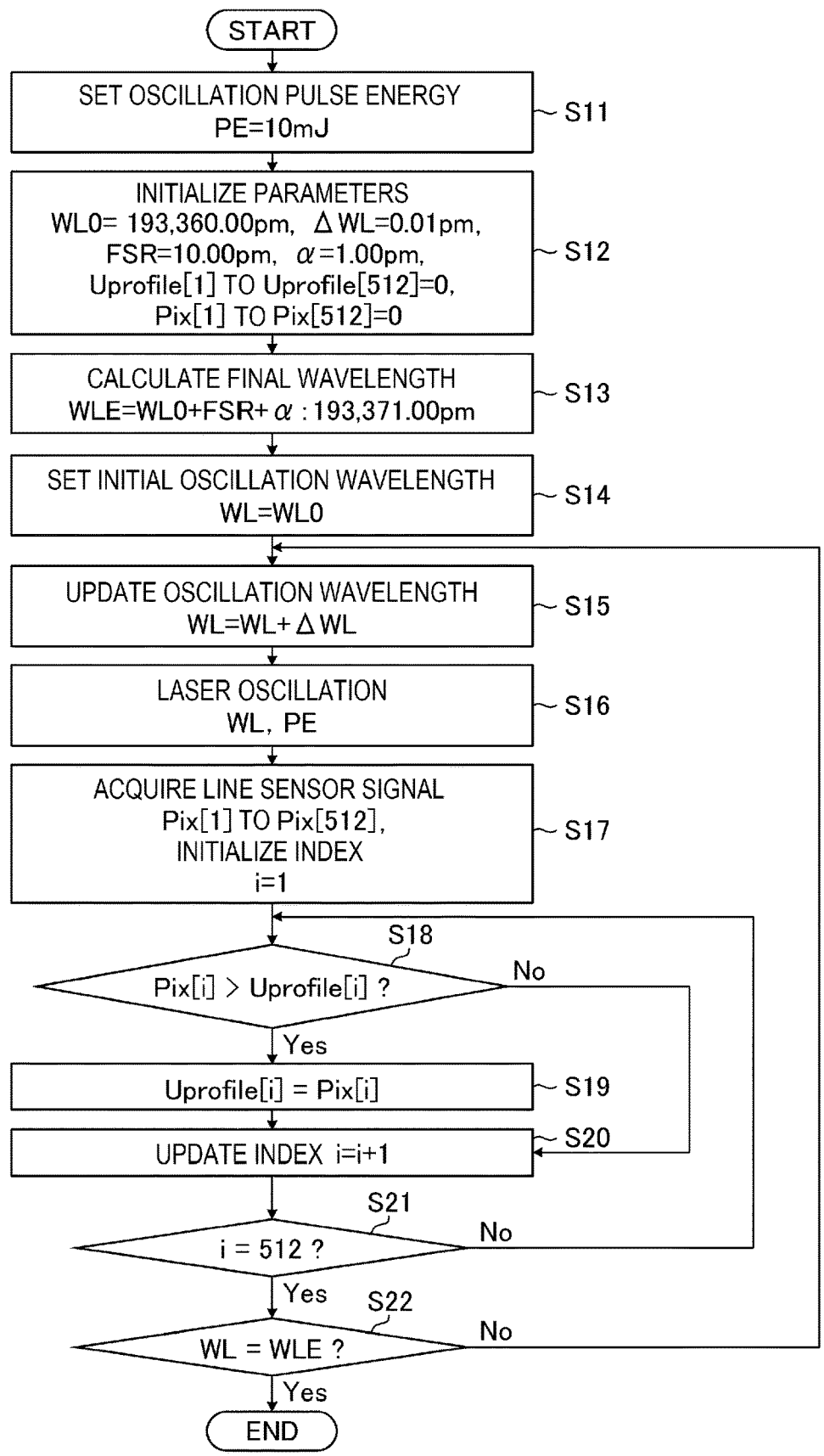
FIG. 7 is a flowchart showing processes of a method for acquiring a sensitivity uniformity profile showing the uniformity of the sensitivity of a line sensor.

An example of the evaluation of degradation of the line sensor 52 will be described. The line sensor degradation evaluation method according to the second embodiment uses a sensitivity uniformity profile (U profile) showing the uniformity of the sensitivity of the line sensor 52. FIG. 7 is a flowchart showing processes of a method for acquiring the U profile of the line sensor 52.

In step S11, the laser controller 61 sets the oscillation pulse energy PE at 10 mJ.

In step S12, the laser controller 61 initializes each parameter. In step S12, the laser controller 61 sets the initial oscillation wavelength WL0 at 193,360.00 pm, the wavelength interval ΔWL at 0.01 pm, the free spectral range FSR, which corresponds to a swing width, at 10.00 pm, which is the same as FSRf of the fine etalon 47, a margin α at 1.00 pm, arrays Uprofile[1] to Uprofile[512] at 0, and arrays Pix[1] to Pix[512] at 0.

In step S13, the laser controller 61 calculates the final oscillation wavelength WLE. The final oscillation wavelength WLE can be expressed by WLE=WL0+FSR+α. The final oscillation wavelength WLE in the description is 193,371.00 pm.

In step S14, the laser controller 61 sets the oscillation wavelength WL at the initial oscillation wavelength WL0.

In step S15, the laser controller 61 adds the wavelength interval ΔWL to the oscillation wavelength WL to update the oscillation wavelength WL.

In step S16, the laser controller 61 causes the laser oscillation to occur at the oscillation pulse energy PE with the target wavelength λt being equal to the oscillation wavelength WL. The pulsed laser light having the oscillation wavelength WL and the oscillation pulse energy PE thus enters the fine etalon 47.

In step S17, the laser controller 61 substitutes the measured values at the pixels of the line sensor 53 into the arrays Pix[1] to Pix[512] to acquire the intensity distribution corresponding to the interference fringes (example of intensity distribution acquisition step). The laser controller 61 initializes the index i, which represents the pixel position in the line sensor 53, to 1.

In step S18, the laser controller 61 evaluates whether or not the value of the array Pix[i] is greater than the value of the array Uprofile[i]. When Pix[i]>Uprofile[i] is satisfied, the laser controller 61 carries out the process in step S19 and then carries out the process in step S20. When Pix[i]>Uprofile[i] is not satisfied, the laser controller 61 carries out the process in step S20.

In step S19, the laser controller 61 substitutes the value of the array Pix[i] into the array Uprofile[i] (example of profile acquisition step).

In step S20, the laser controller 61 updates the index i by adding 1 thereto.

In step S21, the laser controller 61 evaluates whether or not the index i is 512. When i=512 is not satisfied, the laser controller 61 carries out the process in step S18. When i=512 is satisfied, the laser controller 61 carries out the process in step S22.

In step S22, the laser controller 61 evaluates whether or not the oscillation wavelength WL is the final oscillation wavelength WLE. When WL=WLE is not satisfied, the laser controller 61 carries out the process in step S15. When WL=WLE is satisfied, the laser controller 61 terminates the processes of the flowchart.

Repeating the process in step S15 updates the oscillation wavelength WL by incrementing the oscillation wavelength WL by the interval of 0.01 pm from 193,360.01 pm to 193,371.00 pm. The difference between the smallest value and the largest value of the updated oscillation wavelength WL is greater than FSRf of the fine etalon 47.

Repeating the process in step S16 causes a plurality of kinds of laser light having different oscillation wavelengths WL to be successively incident on the fine etalon 47.

Repeating the process in step S17 causes the laser controller 61 to acquire a plurality of intensity distributions corresponding to a plurality of interference fringes successively received by the line sensor 52 in correspondence with the plurality of kinds of laser light having different oscillation wavelengths WL and having been successively incident on the line sensor 52.

Repeating the processes in steps S18 and S19 allows a profile formed of the maximums at the pixels of the line sensor 52 (example of profile over pixels) to be acquired from the plurality of intensity distributions. That is, the finally acquired arrays Uprofile[1] to Uprofile[512] are the U profile showing the maximums at the pixels of the line sensor 53.

Figure 8:
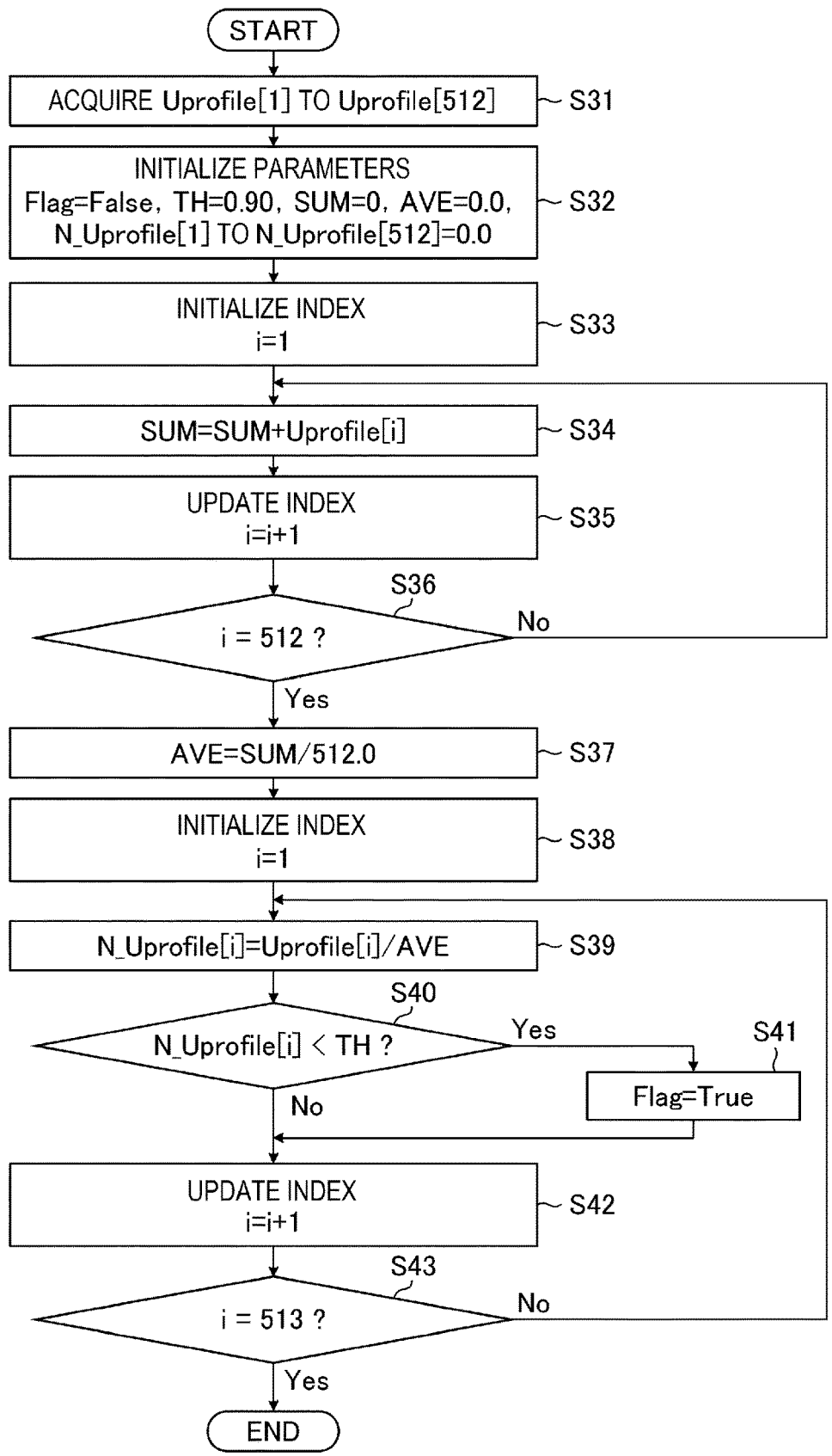
FIG. 8 is a flowchart showing processes of the line sensor degradation evaluation method using a U profile.

FIG. 8 is a flowchart showing processes of the line sensor degradation evaluation method using the U profile.

In step S31, the laser controller 61 acquires Uprofile[1] to Uprofile[512] in accordance with the method for acquiring the U profile of the line sensor 52 shown in FIG. 7.

In step S32, the laser controller 61 initializes each parameter. In step S32, the laser controller 61 sets the evaluation result Flag at False, the threshold TH at 0.90, a total SUM at 0, an average AVE at 0.0, arrays N_Uprofile[1] to N_Uprofile[512] at 0.0.

In step S33, the laser controller 61 initializes the index i to 1.

In step S34, the laser controller 61 adds Uprofile[i] to the total SUM.

In step S35, the laser controller 61 updates the index i by adding 1 thereto.

In step S36, the laser controller 61 evaluates whether or not the index i is 512. When i=512 is not satisfied, the laser controller 61 carries out the process in step S34. When i=512 is satisfied, the laser controller 61 carries out the process in step S37.

Repeating the process in step S34 until the index i reaches 512 causes the total SUM to be the sum of the values of the arrays Uprofile[1] to Uprofile[512].

In step S37, the laser controller 61 calculates the average AVE of the values of the arrays Uprofile[1] to Uprofile[512] in accordance with AVE=SUM/512.

In step S38, the laser controller 61 initializes the index i to 1.

In step S39, the laser controller 61 calculates a normalized U profile that is the value of the array Uprofile[i] normalized by the average AVE (example of degradation parameter acquisition step). In the description, the value of Uprofile[i]/AVE is substituted into the array N_Uprofile[i].

In step S40, the laser controller 61 compares the value of the array N_Uprofile[i] (example of degradation parameter) with the threshold TH (example of comparison step) to evaluate whether or not the threshold TH is greater than the value of the array N_Uprofile[i] (example of evaluation step). When N_Uprofile[i]<TH is satisfied, the laser controller 61 carries out the process in step S41 and then carries out the process in step S42. When N_Uprofile[i]<TH is not satisfied, the laser controller 61 carries out the process in step S42.

In step S41, the laser controller 61 sets the evaluation result Flag at True (example of output step).

In step S42, the laser controller 61 updates the index i by adding 1 thereto.

In step S43, the laser controller 61 evaluates whether or not the index i is 513. When i=513 is not satisfied, the laser controller 61 carries out the process in step S39. When i=513 is satisfied, the laser controller 61 terminates the processes of the flowchart.

When the processes in steps S39 and S40 are repeated and N_Uprofile[i]<TH is satisfied even once, the evaluation result Flag is set at True in step S41. That is, when at least one of the degradation parameters is smaller the threshold TH, the laser controller 61 determines that the line sensor 52 has been degraded and outputs the signal that prompts replacement of the monitor module 40.

FIG. 9 shows an example of the normalized U profile. In FIG. 9, the horizontal axis represents the pixel position in the line sensor 52, and the vertical axis represents a degradation ratio (expressed in %). F9A in FIG. 9 shows the normalized U profile in the case where no degradation has occurred, and F9B shows the normalized U profile in the case where degradation has occurred. In the normalized U profile in the case where no degradation has occurred, the degradation ratio at all pixels of the line sensor 52 is substantially 0%, as shown in F9A. In the normalized U profile in the case where degradation has occurred, there are pixels where the degradation ratio exceeds −5%.

A degradation limit reference may be −5% (threshold TH may be 0.95).

The above description has been made with reference to the case where degradation of the line sensor 52 in the narrowed-line laser apparatus 1 is evaluated, and degradation of the line sensor 53 may instead be evaluated. To evaluate degradation of the line sensor 53, the free spectral range FSR, which corresponds to the swing width, is made equal to FSRc of the coarse etalon 48. Furthermore, to evaluate degradation of the line sensor 53, the degradation limit reference may be −20% (threshold value TH may be 0.80). Degradation of at least one of the line sensors 52 and 53 in the narrowed-line laser apparatus 2 may be evaluated.

6.3 Effects and Advantages

According to the second embodiment, even the narrowed-line laser apparatuses 1 and 2 having been installed in the field can each evaluate degradation of at least one of the line sensors 52 and 53. The state of the degradation of the line sensors 52 and 53 can therefore be separately grasped.

According to the second embodiment, the sensitivity degradation at the pixels of the line sensors 52 and 53 can be quantitatively and separately assessed by using the normalized U profile, which is the U profile normalized by the average AVE.

7. Third Embodiment 7.1 Configuration

Figure 10:
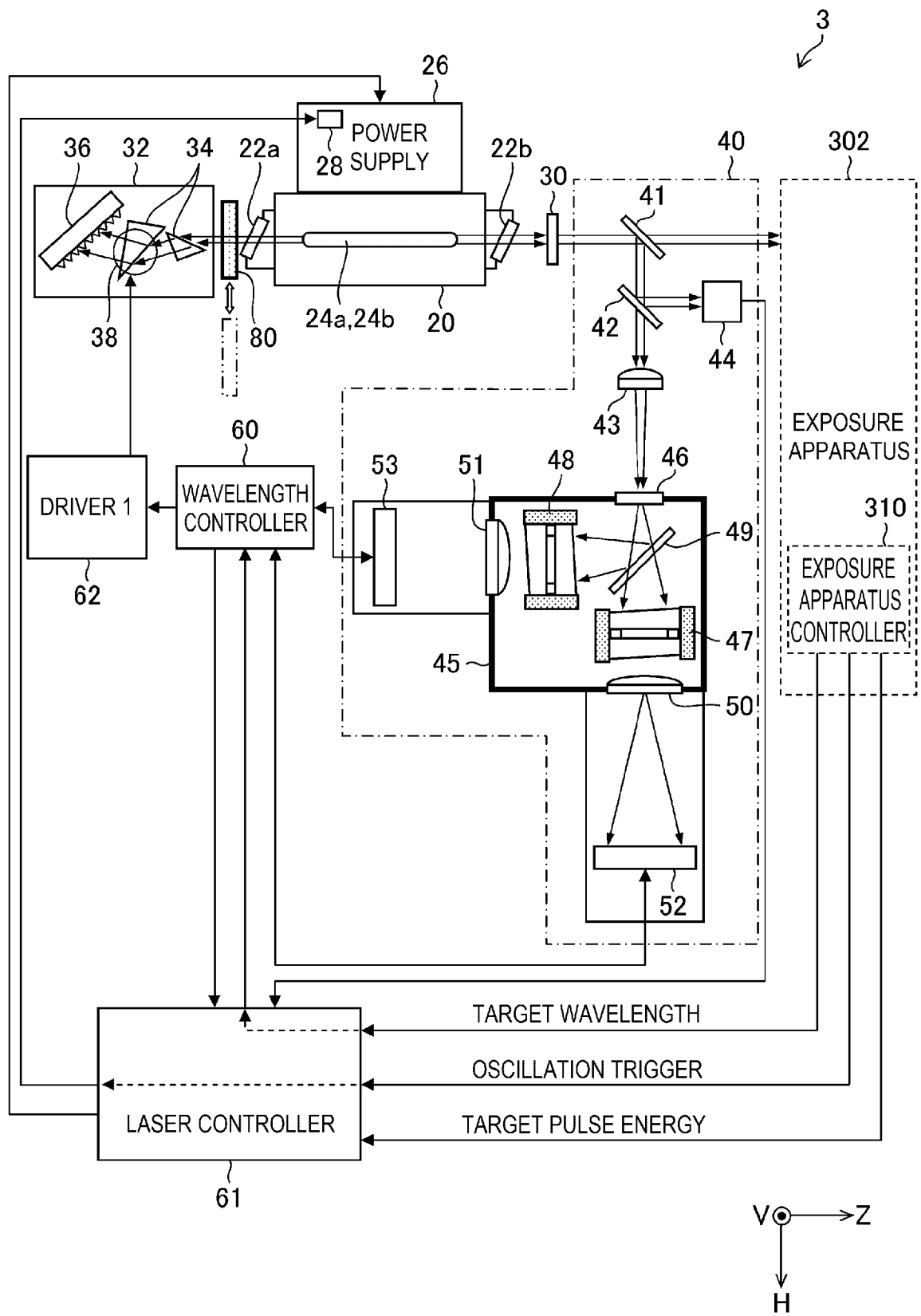
FIG. 10 shows the configuration of a narrowed-line laser apparatus.

FIG. 10 shows the configuration of a narrowed-line laser apparatus 3. The narrowed-line laser apparatus 3 includes a total reflection mirror 80.

The total reflection mirror 80 is provided with an advance/retraction mechanism that is not shown. The total reflection mirror 80 is inserted into the space between the chamber 20 and the line narrowing module 32 (example of line narrowing optical system) or retracted from the space between the chamber 20 and the line narrowing module 32 by the advance/retraction mechanism.

The narrowed-line laser apparatus 3 may be provided with an exchange mechanism and an alignment mechanism and so configured that the total reflection mirror 80 is manually placed between the chamber 20 and the line narrowing module 32.

7.2 Operation

Figure 11:
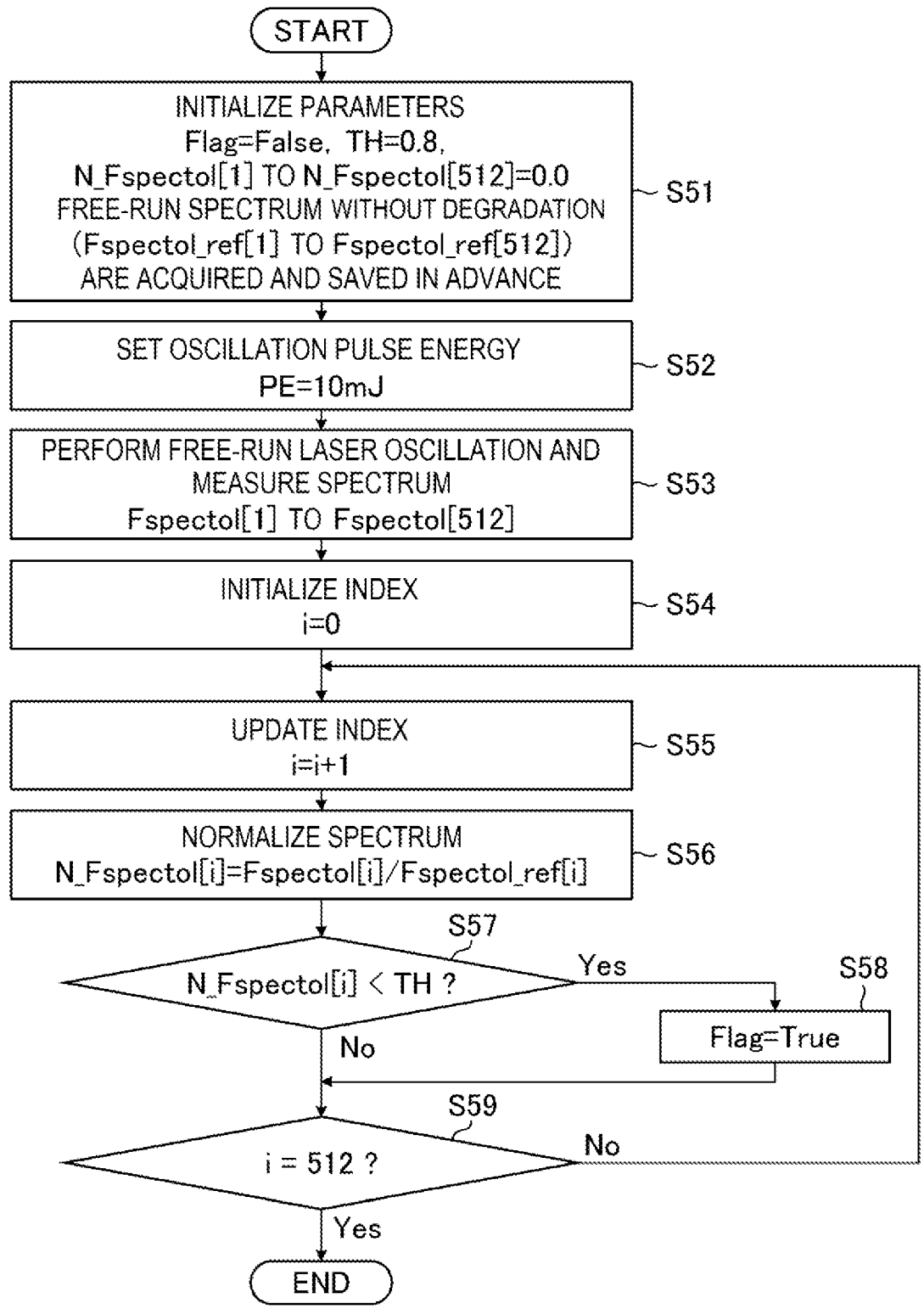
FIG. 11 is a flowchart showing processes of another line sensor degradation evaluation method.

FIG. 11 is a flowchart showing the processes of another line sensor degradation evaluation method. The following description will be made with reference to a case where degradation of the line sensor 53 in the narrowed-line laser apparatus 3 is evaluated.

In step S51, the laser controller 61 initializes each parameter. In step S51, the laser controller 61 sets the evaluation result Flag at False, the threshold TH at 0.8, and arrays N_Fspectol[1] to N_Fspectol[512] at 0.0.

The laser controller 61 needs to acquire in advance a free-run spectrum in the state in which the line sensor 53 has not been degraded, which will be described later.

In step S52, the laser controller 61 sets the oscillation pulse energy PE at 10 mJ.

In step S53, the laser controller 61 causes the advance/retraction mechanism to insert the total reflection mirror 80 into the space between the chamber 20 and the line narrowing module 32 (example of insertion step). The total reflection mirror 80 and the output coupling mirror 30 thus form a laser resonator, which enables free-run oscillation at the oscillation pulse energy PE. The laser light produced by the free-run oscillation (example of non-narrowed-line laser light) enters the coarse etalon 48.

The laser controller 61 substitutes measured values at the pixels of the line sensor 53 into the arrays Fspectol[1] to Fspectol[512] to acquire the intensity distribution of the fringe waveform (example of intensity distribution acquisition step). In the description, the fringe waveform produced at the light receiving surface of the line sensor 53 is called a spectral waveform, and the intensity distribution acquired from the line sensor 53 is called the free-run spectrum.

The laser controller 61 further acquires in advance the free-run spectrum in the state in which the line sensor 53 has not been degraded (example of reference intensity distribution) (example of step before evaluation step). That is, the laser controller 61 sets the oscillation pulse energy PE at 10 mJ to cause the free-run oscillation to occur and substitutes measured values at the pixels of the line sensor 53 that has not been degraded into arrays Fspectol_ref[1] to Fspectol_ref[512] (example of reference intensity distribution acquisition step). The laser controller 61 stores the values of the arrays Fspectol_ref[1] to Fspectol_ref[512] in a memory that is not shown (example of storage step). The free-run spectrum in the state in which the line sensor 53 has not been degraded may not be acquired by the laser controller 61 but may instead be acquired by a computer for inspection (example of processor) at the time of shipment from the manufacturer. The free-run spectrum in the state in which the line sensor 53 has not been degraded is called a reference free-run spectrum.

In step S54, the laser controller 61 initializes the index i, which represents the pixel position in the line sensor 53, to 0.

In step S55, the laser controller 61 updates the index i by adding 1 thereto.

In step S56, the laser controller 61 calculates a normalized free-run spectrum formed of the value of the array Fspectol[i] normalized by the value of the array Fspectol_ref[i] (example of degradation parameter acquisition step). In step S56, the value of Fspectol[i]/Fspectol_ref[i] is substituted into the array N_Fspectol[i].

In step S57, the laser controller 61 compares the value of the array N_Fspectol[i] (example of degradation parameter) with the threshold TH (example of comparison step) to evaluate whether or not the threshold TH is greater than the value of the array N_Fspectol[i]. When N_Fspectol[i]<TH is satisfied, the laser controller 61 carries out the process in step S58 and then carries out the process in step S59. When N_Fspectol[i]<TH is not satisfied, the laser controller 61 carries out the process in step S59.

In step S58, the laser controller 61 sets the evaluation result Flag at True (example of output step).

In step S59, the laser controller 61 evaluates whether or not the index i is 512. When i=512 is not satisfied, the laser controller 61 carries out the process in step S55. When i=512 is satisfied, the laser controller 61 terminates the processes of the flowchart.

When the processes in step S56 and S57 are repeated and N_Fspectol[i]<TH is satisfied even once, the evaluation result Flag is set at True in step S58. That is, when at least one of the values of the degradation parameters is smaller the threshold TH, the laser controller 61 determines that the line sensor 53 has been degraded and outputs the signal that prompts replacement of the monitor module 40.

FIG. 12 shows an example of the free-run spectrum in the state in which no degradation has occurred. F12A shows the reference free-run spectrum. In F12A, the horizontal axis represents the pixel position in the line sensor 53, and the vertical axis represents the measured value. F12B shows the normalized free-run spectrum, which is obtained by normalizing the reference free-run spectrum shown in F12A. In F12B, the horizontal axis represents the pixel position in the line sensor 53, and the vertical axis represents the ratio to the reference (expressed in %).

FIG. 13 shows an example of the free-run spectrum in the state in which degradation has occurred. F13A shows the free-run spectrum. In F13A, the horizontal axis represents the pixel position in the line sensor 53, and the vertical axis represents the measured value. F13B shows the normalized free-run spectrum, which is obtained by normalizing the free-run spectrum F13A by the reference free-run spectrum. In F13B, the horizontal axis represents the pixel position in the line sensor 53, and the vertical axis represents the ratio to the reference (expressed in %).

In the example shown in FIG. 13, the normalized free-run spectrum shows pixels where the ratio to the reference is smaller than 0.8. When the threshold TH is set at 0.8, the evaluation result Flag is True, and the laser controller 61 outputs the signal that prompts the replacement of the monitor module 40.

7.3 Effects and Advantages

Changing the wavelength over a range wider than FSRc of the coarse etalon 48, as in the second embodiment, is an operation desired to be avoided from the viewpoint of control performed by the narrowed-line laser apparatus 3. The reason for this is that changing the wavelengths beyond FSRc makes it difficult to maintain the pulse energy constant over the entire wavelength range, and that there is a risk of losing track of the fringe order of the interference fringes produced by the coarse etalon 48. According to the third embodiment, in which the oscillation wavelength is not changed, the difficulty and risk described above are not involved.

According to the third embodiment, degradation of the sensitivity of the pixels of at least one of the line sensors 52 and 53 can be quantitatively assessed by using the normalized free-run spectrum, which is the free-run spectrum normalized by the reference free-run spectrum.

8. Fourth Embodiment 8.1 Configuration

The hardware configuration according to a fourth embodiment is the same as that of the narrowed-line laser apparatus 1. The narrowed-line laser apparatus 1 includes a switch that is not shown but turns on and off the power supply of the apparatus.

8.2 Operation

The laser controller 61 periodically carries out the processes of the line sensor degradation evaluation method according to the first embodiment to acquire the FC_diff profile. The laser controller 61 predicts the timing when the monitor module 40 should be replaced (number of shots that causes predetermined amount of degradation to be reached) by analyzing the trend (transition) of the amount of degradation with respect to the number of shots in the acquired FC_diff profile.

For example, the laser controller 61 carries out the processes of the line sensor degradation evaluation method according to the first embodiment at the time of periodic maintenance associated with the monitor module 40 when the number of shots reaches a number ranging from 20 Bpls (billion pulses) to 50 Bpls. The laser controller 61 instead automatically carries out the processes of the line sensor degradation evaluation method according to the first embodiment (example of control step) at least one of the following timing: when the narrowed-line laser apparatus 1 is powered on; when the narrowed-line laser apparatus 1 is powered off; and when the laser gas is replaced.

Figure 14:
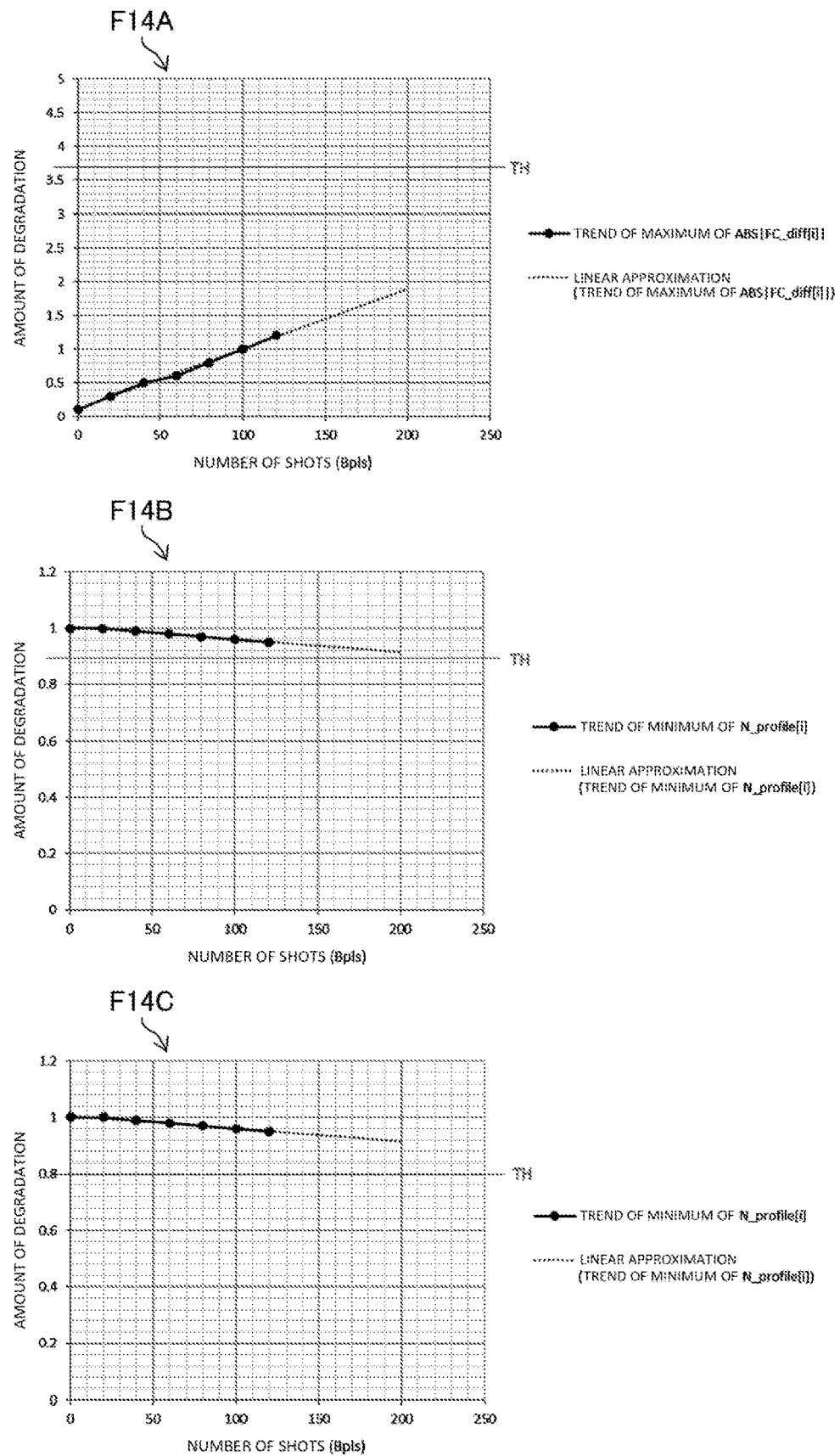
FIG. 14 describes prediction of the timing when a monitor module should be replaced.

FIG. 14 describes the prediction of the timing when the monitor module 40 should be replaced. In FIG. 14, the horizontal axis represents the number of shots, and the vertical axis represents the amount of degradation. FIG. 14 further shows the threshold TH. The circular plotting dots and the solid line in F14A shown in FIG. 14 show the trend of the amount of degradation in the form of maximum of ABSlFC_diff[i]l, and the dotted line shows a linear approximation model of the trend of the amount of degradation.

The laser controller 61 predicts the point of time when the linear approximation model of the trend of the amount of degradation reaches the threshold TH as the timing when the monitor module 40 should be replaced, which corresponds to the lifetime of at least one of the line sensors 52 and 53 (example of prediction step).

The laser controller 61 may instead predict the timing when the monitor module 40 should be replaced by periodically carrying out the processes of the line sensor degradation evaluation method according to the second embodiment and analyzing the trend of the amount of degradation with respect to the number of shots in the normalized U profile.

The circular plotting dots and the solid line in F14B shown in FIG. 14 show the trend of the amount of degradation in the form of minimum of the array Uprofile[i], and the dotted line shows a linear approximation model of the trend of the amount of degradation.

In the narrowed-line laser apparatus 3, the laser controller 61 may periodically carry out the processes of the line sensor degradation evaluation method according to the third embodiment and analyze the trend of the amount of degradation with respect to the number of shots in the normalized free-run spectrum to predict the point of time when the linear approximation model of the trend of the amount of degradation reaches the threshold TH, and predict the timing when the monitor module 40 should be replaced.

The circular plotting dots and the solid line in F14C shown in FIG. 14 show the trend of the amount of degradation in the form of minimum of the array N_Fspectol[i], and the dotted line shows a linear approximation model of the trend of the amount of degradation.

The models described above each allow prediction of the number of shots that causes the threshold TH to be reached as the timing when the monitor module 40 should be replaced.

8.3 Effects and Advantages

According to the fourth embodiment, the timing when the monitor module 40 should be replaced can be grasped, whereby unnecessary replacement of the monitor module 40 can be avoided. Furthermore, the timing when the monitor module 40 should be replaced can be accurately predicted and can therefore be reflected in the operation plan and maintenance schedule of the narrowed-line laser apparatus 1. The downtime of the manufacturing steps can thus be shortened, whereby the chip cost can be reduced.

9. Fifth Embodiment 9.1 Configuration

Figure 15:
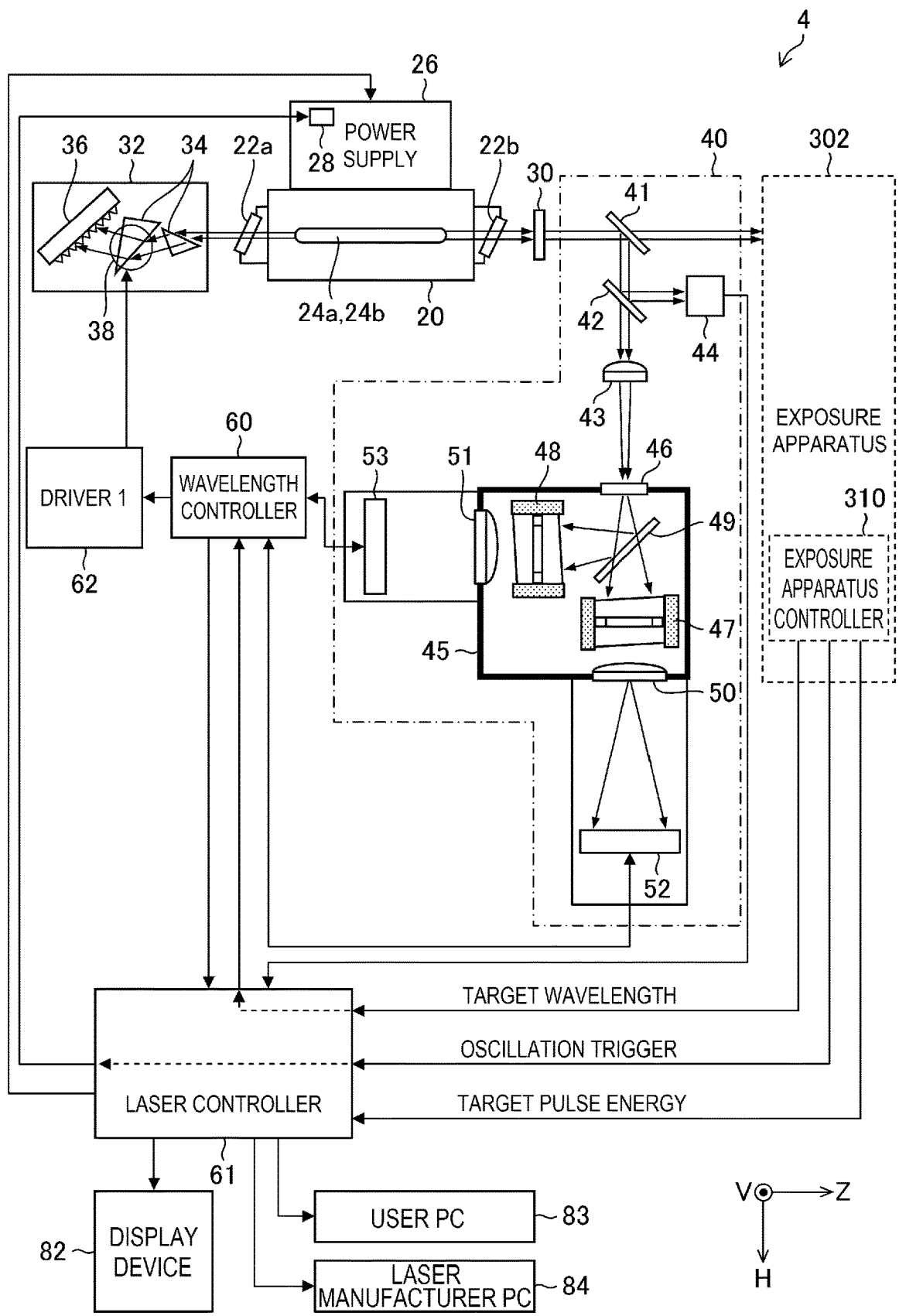
FIG. 15 shows the configuration of a laser system.

FIG. 15 shows the configuration of a laser system 4. The laser system 4 includes a display device 82, a user PC (personal computer) 83, and a laser manufacturer PC 84.

The display device 82 is, for example, a PATLITE (registered trademark) or a display. The user PC 83 is a computer used by a user of the narrowed-line laser apparatus 1 and is communicably connected to the laser controller 61. The laser manufacturer PC 84 is a computer for maintenance used by a serviceman of the narrowed-line laser apparatus 1 and is communicably connected to the laser controller 61.

Figure 16:
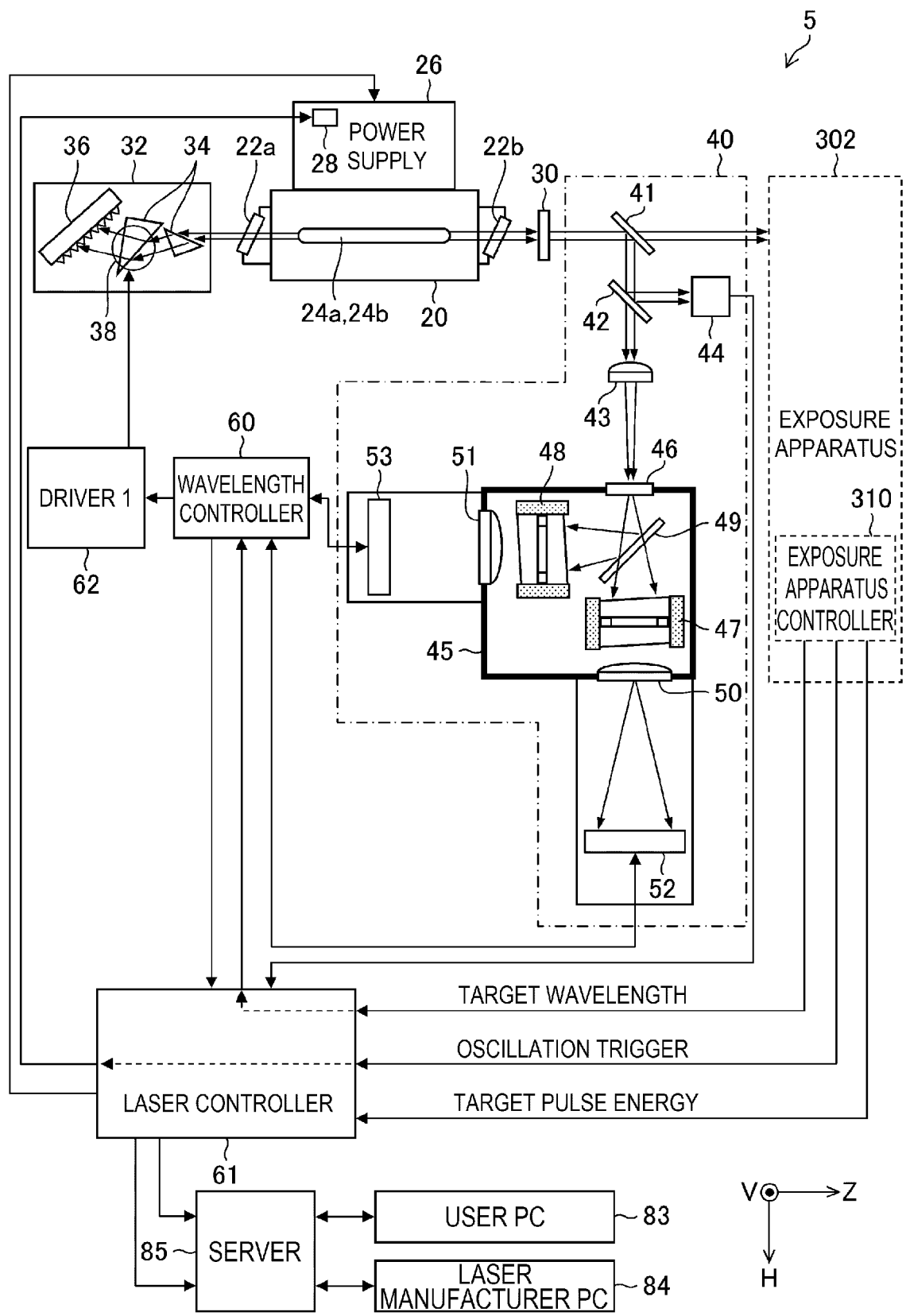
FIG. 16 shows the configuration of another laser system.

FIG. 16 shows the configuration of a laser system 5, which is a variation of the laser system 4. The laser system 5 includes a server 85. The server 85 is disposed between the laser controller 61 and the set of the user PC 83 and the laser manufacturer PC 84, and is communicably connected to the laser controller 61, the user PC 83, and the laser manufacturer PC 84.

The laser systems 4 and 5 may each include the narrowed-line laser apparatus 2 or 3 in place of the narrowed-line laser apparatus 1.

9.2 Operation

The laser systems 4 and 5 each use at least one of degradation evaluation result data, degradation parameters, and apparatus state data.

The degradation evaluation result data includes at least one of the evaluation result Flag and the threshold TH. The degradation parameters include at least one of the FC_diff profile, the normalized U profile, and the normalized free-run spectrum. The apparatus state data includes at least one of the time when the processes of the line sensor degradation evaluation method according to any of the first to third embodiments are carried out, the number of shots (pulses) of the laser oscillation, and the number of shots of the sampling performed by the monitor module 40. The laser systems 4 and 5, for example, each acquire the apparatus state data when the processes of the line sensor degradation evaluation method according to the first embodiment are carried out (example of state acquisition step). The processes of the sensor degradation evaluation method may be those in the second or third embodiment. The processes of the sensor degradation evaluation methods of a plurality of the embodiments may be carried out.

The laser controller 61 carries out the processes of the line sensor degradation evaluation method according to the first embodiment and informs, based on the evaluation result Flag, which is one of the degradation evaluation result data, the user of whether or not degradation has occurred in at least one of the line sensors 52 and 53 in the form of display on the display device 82. The laser controller 61 may further display the threshold TH, which is one of the degradation evaluation result data, on the display device 82.

The user PC 83 and the laser manufacturer PC 84 may each acquire the degradation evaluation result data from the laser controller 61 and carry out the processes of the line sensor degradation evaluation method. The user PC 83 and the laser manufacturer PC 84 may acquire the degradation parameters from the laser controller 61 and grasp the degree of degradation of at least one of the line sensors 52 and 53. The user PC 83 and the laser manufacturer PC 84 may each acquire the degradation evaluation result data, the degradation parameters, and the state data from the laser controller 61 and predict the timing when the monitor module 40 should be replaced, which is shown in the fourth embodiment.

When the laser system 5 is used, the server 85 has a data buffering function. Therefore, the degradation evaluation result data, the degradation parameters, and the state data may be accumulated over a long period asynchronously with the processes of the line sensor degradation evaluation method according to any of the first to third embodiments, and may be shared by the laser controller 61, the user PC 83, and the laser manufacturer PC 84. Accumulating and sharing the data as described above allow the user and the laser manufacturer to effectively analyze the data. The analysis can contribute to effective apparatus operation and reduction in downtime.

9.3 Effects and Advantages

According to the laser system 4 or 5, information on degradation of at least one of the line sensors 52 and 53 can be effectively provided to an apparatus outside the narrowed-line laser apparatus 1 for efficient operation of the narrowed-line laser apparatus 1.

10. Method for Manufacturing Electronic Devices

Figure 17:
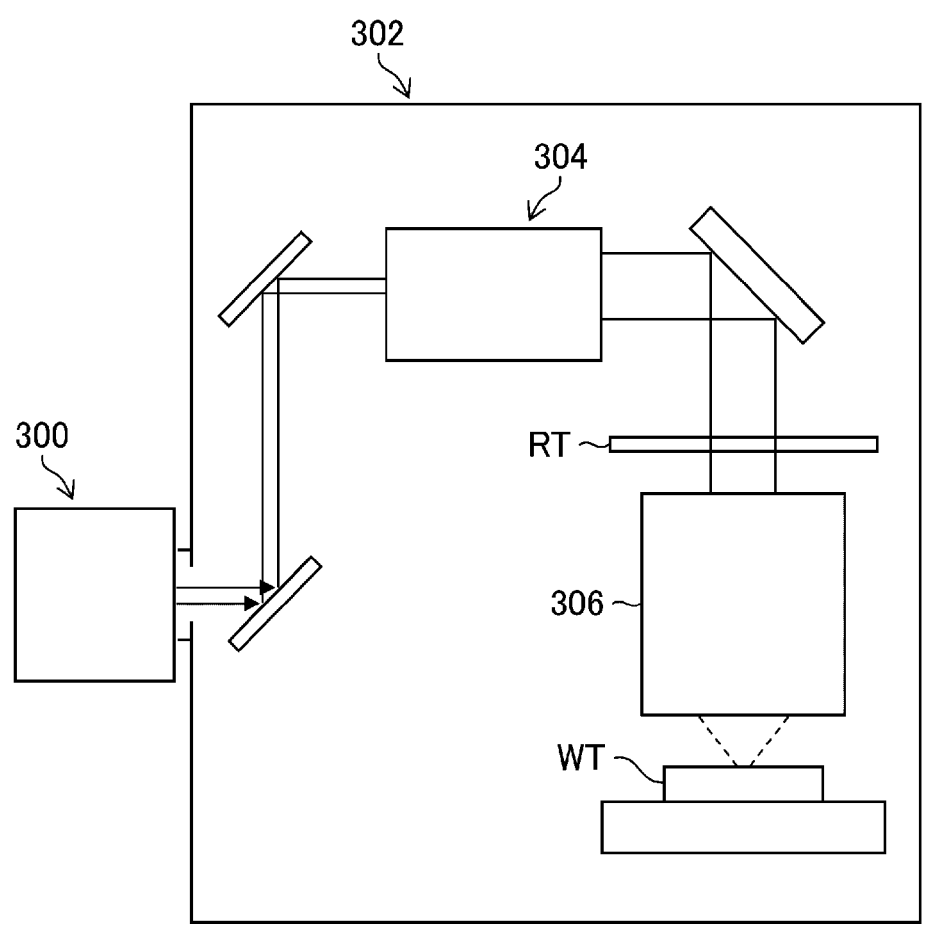
FIG. 17 schematically shows an example of the configuration of an exposure apparatus.

FIG. 17 schematically shows an example of the configuration of the exposure apparatus 302. The method for manufacturing electronic devices is realized by an excimer laser apparatus 300 and the exposure apparatus 302.

The excimer laser apparatus 300 may include the narrowed-line laser apparatus 1, 2, or 3 described in the embodiments. The excimer laser apparatus 300 may be connected to at least one of the display device 82, the user PC 83, the laser manufacturer PC 84, and the server 85.

Pulsed laser light outputted from the excimer laser apparatus 300 is inputted to the exposure apparatus 302 and used as exposure light.

The exposure apparatus 302 includes an illumination optical system 304 and a projection optical system 306. The illumination optical system 304 illuminates a reticle pattern on a reticle stage RT with the pulsed laser light having entered the exposure apparatus 302 from the excimer laser apparatus 300. The projection optical system 306 performs reduction projection on the pulsed laser light having passed through the reticle to bring the pulsed laser light into focus on a workpiece that is not shown but is placed on a workpiece table WT. The workpiece is a light sensitive substrate onto which a photoresist has been applied, such as a semiconductor wafer. The exposure apparatus 302 translates the reticle stage RT and the workpiece table WT in synchronization with each other to expose the workpiece to the pulsed laser light having reflected the reticle pattern. Semiconductor devices can be manufactured by transferring a device pattern onto the semiconductor wafer in the exposure step described above. The semiconductor devices are an example of the "electronic devices" in the present disclosure.

11. Others

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious for those skilled in the art that embodiments of the present disclosure would be appropriately combined.

The terms used throughout the present specification and the appended claims should be interpreted as non-limiting terms. For example, terms such as "comprise", "include", "have", and "contain" should not be interpreted to be exclusive of other structural elements. Further, indefinite articles "a/an" described in the present specification and the appended claims should be interpreted to mean "at least one" or "one or more". Further, "at least one of A, B, and C" should be interpreted to mean any of A, B, C, A+B, A+C, B+C, and A+B+C as well as to include combinations of the any thereof and any other than A, B, and C.

What is claimed is:

1. A sensor degradation evaluation method comprising:
an evaluation step of causing a processor to evaluate degradation of at least one of a sensor for coarse measurement configured to receive interference fringes produced by a spectrometer for coarse measurement and a sensor for fine measurement configured to receive interference fringes produced by a spectrometer for fine measurement having resolution higher than resolution of the spectrometer for coarse measurement; and
an output step of causing the processor to output a result of the evaluation,
the evaluation step including
a coarse-measurement wavelength acquisition step of causing a plurality of kinds of laser light having wavelengths different from one another to be sequentially incident on the spectrometer for coarse measurement and acquiring a coarse-measurement wavelength on a wavelength basis from a plurality of the interference fringes sequentially received by the sensor for coarse measurement,
a fine-measurement wavelength acquisition step of causing the plurality of kinds of laser light to be sequentially incident on the spectrometer for fine measurement and acquiring a fine-measurement wavelength on a wavelength basis from a plurality of the interference fringes sequentially received by the sensor for fine measurement;
a degradation parameter acquisition step of acquiring a degradation parameter on a wavelength basis from the coarse-measurement wavelength and the fine-measurement wavelength measured on a wavelength basis; and
a comparison step of comparing the degradation parameter on a wavelength basis with a threshold.

2. The sensor degradation evaluation method according to claim 1,
wherein the degradation parameter acquisition step includes calculating the degradation parameter on a wavelength basis from a difference between the coarse-measurement wavelength and the fine-measurement wavelength on a wavelength basis.

3. The sensor degradation evaluation method according to claim 1,
wherein the plurality of kinds of laser light are so configured that a difference in wavelength between laser light having a shortest wavelength and laser light having a longest wavelength is smaller than a free spectral range of the spectrometer for course measurement.

4. The sensor degradation evaluation method according to claim 3,
wherein the plurality of kinds of laser light differ in wavelength from one another by a free spectral range of the spectrometer for fine measurement.

5. The sensor degradation evaluation method according to claim 1,
further comprising a splitting step of splitting the plurality of kinds of laser light having wavelengths different from one another into the plurality of kinds of laser light to be incident on the spectrometer for coarse measurement and the plurality of kinds of laser light to be incident on the spectrometer for fine measurement.

6. The sensor degradation evaluation method according to claim 1,
wherein the plurality of kinds of laser light each have constant pulse energy.

7. The sensor degradation evaluation method according to claim 1,
wherein the spectrometer for coarse measurement includes at least one of an etalon and a grating.

8. The sensor degradation evaluation method according to claim 1,
wherein the spectrometer for fine measurement includes an etalon.

9. The sensor degradation evaluation method according to claim 1,
wherein the comparison step includes a prediction step of predicting a lifetime of at least one of the sensor for coarse measurement and the sensor for fine measurement based on a transition of the degradation parameter on a wavelength basis.

10. The sensor degradation evaluation method according to claim 1,
wherein the comparison step includes a prediction step of predicting the lifetime of at least one of the sensor for coarse measurement and the sensor for fine measurement by comparing the transition of the degradation parameter on a wavelength basis with the threshold.

11. The sensor degradation evaluation method according to claim 1,
wherein the output step includes displaying the result of the evaluation on a display device.

12. The sensor degradation evaluation method according to claim 1,
wherein the sensor for coarse measurement and the sensor for fine measurement are each a line sensor.

13. The sensor degradation evaluation method according to claim 1,
wherein a laser apparatus configured to output the plurality of kinds of laser light includes a switch configured to power on and off the laser apparatus, and
a chamber configured to accommodate a laser gas, and
the method further comprises a control step of causing the processor to
perform the evaluation step at at least one of timings below: when maintenance of the laser apparatus is performed; when the laser apparatus is powered on; when the laser apparatus is powered off; and when the laser gas is replaced.

14. The sensor degradation evaluation method according to claim 13,
further comprising a state acquisition step of acquiring at least one of time when the evaluation step is executed, the number of shots performed by the laser apparatus, and the number of shots performed by the spectrometer for coarse measurement and the spectrometer for fine measurement.

15. A sensor degradation evaluation method comprising:
an evaluation step of causing a processor to evaluate degradation of a sensor configured to receive interference fringes produced by a spectrometer; and
an output step of causing the processor to output a result of the evaluation,
the evaluation step including
an intensity distribution acquisition step of causing a plurality of kinds of laser light having wavelengths different from one another to be sequentially incident on the spectrometer and acquiring a plurality of intensity distributions corresponding to a plurality of the interference fringes sequentially received by the sensor,
a profile acquisition step of acquiring a profile over pixels of the sensor from the plurality of intensity distributions, a degradation parameter acquisition step of acquiring a degradation parameter for each of the pixels produced by normalizing the profile over the pixels, and a comparison step of comparing the degradation parameter for each of the pixels with a threshold.

16. The sensor degradation evaluation method according to claim 15, wherein the profile acquisition step includes acquiring a profile formed of maximums at the pixels of the sensor, and the degradation parameter acquisition step includes normalizing the profile formed of the maximums by an average of the maximums at the pixels of the sensor.

17. The sensor degradation evaluation method according to claim 15, wherein a difference in wavelength between laser light having a shortest wavelength and laser light having a longest wavelength out of the plurality of kinds of laser light is greater than a free spectral range of the spectrometer.

18. A sensor degradation evaluation method comprising:

an evaluation step of causing a processor to evaluate degradation of a sensor configured to receive interference fringes produced by a spectrometer; and an output step of causing the processor to output a result of the evaluation, the evaluation step including an intensity distribution acquisition step of causing non-narrowed-line laser light to be incident on the spectrometer and acquiring an intensity distribution of interference fringes received by the sensor, a degradation parameter acquisition step of normalizing the acquired intensity distribution by a reference intensity distribution and acquiring a degradation parameter for each of pixels of the sensor, and a comparison step of comparing the degradation parameter for each of the pixels with a threshold.

19. The sensor degradation evaluation method according to claim 18, further comprising:

a reference intensity distribution acquisition step of causing the non-narrowed-line laser light to be incident on the spectrometer before the evaluation step and causing the processor to acquire the reference intensity distribution from the interference fringes received by the sensor; and a storage step of causing the processor to store the reference intensity distribution in a memory.

20. The sensor degradation evaluation method according to claim 18, wherein a laser apparatus configured to output the non-narrowed-line laser light includes a chamber which is configured to accommodate a laser gas, in which a pair of discharge electrodes are disposed, and which includes a first window and a second window, a line-narrowing optical system disposed in an optical path of light that exits via the first window, and an output coupling mirror which forms along with the line-narrowing optical system a laser resonator, which is disposed in an optical path of light that exits via the second window, and via which part of the light that exits via the second window exits, wherein the intensity distribution acquisition step includes an insertion step of inserting a total reflection mirror into a space between the line narrowing optical system and the chamber of the laser apparatus.

* * * * *